US009275809B2

(12) United States Patent
Panay et al.

(10) Patent No.: US 9,275,809 B2
(45) Date of Patent: Mar. 1, 2016

(54) DEVICE CAMERA ANGLE

(75) Inventors: Panos C. Panay, Redmond, WA (US); Hakon Strande, Redmond, WA (US); Chun Beng Goh, Redmond, WA (US); Harold F. Mantooth, Vancouver, WA (US); Kabir Siddiqui, Sammamish, WA (US); Darryl I. Jensen, Duvall, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 246 days.

(21) Appl. No.: 13/471,054

(22) Filed: May 14, 2012

(65) Prior Publication Data

US 2013/0229534 A1   Sep. 5, 2013

Related U.S. Application Data

(60) Provisional application No. 61/606,321, filed on Mar. 2, 2012, provisional application No. 61/606,301, filed on Mar. 2, 2012, provisional application No. 61/606,313, filed on Mar. 2, 2012, provisional (Continued)

(51) Int. Cl.
*H04N 5/222*   (2006.01)
*H04N 5/228*   (2006.01)
(Continued)

(52) U.S. Cl.
CPC ............. *H01H 13/785* (2013.01); *G05B 11/01* (2013.01); *G06F 1/1618* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01);

(Continued)

(58) Field of Classification Search
None
See application file for complete search history.

(56) References Cited

U.S. PATENT DOCUMENTS

| 578,325 A | 3/1897 | Fleming |
|---|---|---|
| 3,600,528 A | 8/1971 | Leposavic |

(Continued)

FOREIGN PATENT DOCUMENTS

| CA | 990023 | 6/1976 |
|---|---|---|
| CN | 1352767 | 6/2002 |

(Continued)

OTHER PUBLICATIONS

"Corrected Notice of Allowance", U.S. Appl. No. 13/470,633, (Jul. 2, 2013), 2 pages.

(Continued)

*Primary Examiner* — Aung S Moe
*Assistant Examiner* — Euel Cowan
(74) *Attorney, Agent, or Firm* — Jeremy Snodgrass; Judy Yee; Micky Minhas

(57) ABSTRACT

Techniques for device camera angle are described. In one or more implementations, a camera is mounted in a computing device at an angle based on an orientation of the computing device. For example, when the computing device is positioned on a surface and at an angle to the surface (such as when supported by a kickstand), the mounting angle of the camera is such that an optical axis of the camera points forward, and not towards the surface. In at least some implementations, a computing device includes a camera that is physically adjustable to support different orientations of the computing device. In at least some implementations, images that are captured via a camera on a computing device can be manipulated based on an orientation of the computing device.

20 Claims, 11 Drawing Sheets

Related U.S. Application Data application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | |
|---|---|
| *H04N 5/225* | (2006.01) |
| *H01H 13/785* | (2006.01) |
| *H01H 13/79* | (2006.01) |
| *H01H 13/78* | (2006.01) |
| *G06F 3/02* | (2006.01) |
| *G06F 1/16* | (2006.01) |
| *H05K 5/02* | (2006.01) |
| *H04M 1/02* | (2006.01) |
| *H04M 1/725* | (2006.01) |
| *G05B 11/01* | (2006.01) |
| *G06F 3/041* | (2006.01) |
| *H01H 13/704* | (2006.01) |
| *H01H 13/82* | (2006.01) |
| *G06F 3/00* | (2006.01) |
| *G06F 3/01* | (2006.01) |
| *H01H 13/702* | (2006.01) |
| *H01H 13/14* | (2006.01) |
| *H01H 13/703* | (2006.01) |
| *G06F 9/54* | (2006.01) |
| *G06F 11/30* | (2006.01) |
| *G06F 13/10* | (2006.01) |
| *G06F 3/023* | (2006.01) |
| *G06F 3/0488* | (2013.01) |
| *G06F 3/0487* | (2013.01) |
| *H01H 13/807* | (2006.01) |
| *H01H 9/26* | (2006.01) |

(52) U.S. Cl.
CPC ............... *G06F 3/002* (2013.01); *G06F 3/01* (2013.01); *G06F 3/0202* (2013.01); *G06F 3/023* (2013.01); *G06F 3/0414* (2013.01); *G06F 3/0416* (2013.01); *G06F 3/0487* (2013.01); *G06F 3/0488* (2013.01); *G06F 9/541* (2013.01); *G06F 11/3089* (2013.01); *G06F 13/102* (2013.01); *H01H 13/14* (2013.01); *H01H 13/702* (2013.01); *H01H 13/703* (2013.01); *H01H 13/704* (2013.01); *H01H 13/78* (2013.01); *H01H 13/79* (2013.01); *H01H 13/807* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2205/006* (2013.01); *H01H 2211/006* (2013.01); *H01H 2217/004* (2013.01); *H04M 1/0245* (2013.01); *Y10T 16/5401* (2015.01); *Y10T 16/551* (2015.01); *Y10T 29/49826* (2015.01)

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,243,861 A | 1/1981 | Strandwitz |
| 4,261,042 A | 4/1981 | Ishiwatari et al. |
| 4,302,648 A | 11/1981 | Sado et al. |
| 4,317,011 A | 2/1982 | Mazurk |
| 4,317,013 A | 2/1982 | Larson |
| 4,365,130 A | 12/1982 | Christensen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A | 8/1986 | Ono et al. |
| 4,651,133 A | 3/1987 | Ganesan et al. |
| 4,652,704 A | 3/1987 | Franklin |
| 4,724,605 A | 2/1988 | Fiorella |
| 4,735,394 A | 4/1988 | Facco |
| 4,801,771 A | 1/1989 | Mizuguchi et al. |
| 4,824,268 A | 4/1989 | Diernisse |
| 4,864,084 A | 9/1989 | Cardinale |
| 4,990,900 A | 2/1991 | Kikuchi |
| 5,008,497 A | 4/1991 | Asher |
| 5,021,638 A | 6/1991 | Nopper et al. |
| 5,053,585 A | 10/1991 | Yaniger |
| 5,107,401 A | 4/1992 | Youn |
| 5,111,223 A | 5/1992 | Omura |
| 5,128,829 A | 7/1992 | Loew |
| 5,220,318 A | 6/1993 | Staley |
| 5,220,521 A | 6/1993 | Kikinis |
| 5,235,495 A | 8/1993 | Blair et al. |
| 5,253,362 A | 10/1993 | Nolan et al. |
| 5,283,559 A | 2/1994 | Kalendra et al. |
| 5,331,443 A | 7/1994 | Stanisci |
| 5,349,403 A | 9/1994 | Lo |
| 5,363,075 A | 11/1994 | Fanucchi |
| 5,375,076 A | 12/1994 | Goodrich et al. |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,581,682 A | 12/1996 | Anderson et al. |
| 5,596,700 A | 1/1997 | Darnell et al. |
| 5,617,343 A | 4/1997 | Danielson et al. |
| 5,621,494 A | 4/1997 | Kazumi et al. |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,803,748 A | 9/1998 | Maddrell et al. |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,874,697 A | 2/1999 | Selker et al. |
| 5,905,485 A | 5/1999 | Podoloff |
| 5,920,317 A | 7/1999 | McDonald |
| 5,924,555 A | 7/1999 | Sadamori et al. |
| 5,926,170 A | 7/1999 | Oba |
| 5,929,946 A | 7/1999 | Sharp et al. |
| 5,971,635 A | 10/1999 | Wise |
| 5,995,026 A | 11/1999 | Sellers |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A | 3/2000 | Seffernick et al. |
| 6,042,075 A | 3/2000 | Burch, Jr. |
| 6,044,717 A | 4/2000 | Biegelsen et al. |
| 6,055,705 A | 5/2000 | Komatsu et al. |
| 6,061,644 A | 5/2000 | Leis |
| 6,108,200 A * | 8/2000 | Fullerton ................ 361/679.12 |
| 6,128,007 A | 10/2000 | Seybold |
| 6,141,388 A | 10/2000 | Servais et al. |
| 6,178,085 B1 | 1/2001 | Leung |
| 6,178,443 B1 | 1/2001 | Lin |

(56) References Cited

U.S. PATENT DOCUMENTS

| | | |
|---|---|---|
| 6,188,391 B1 | 2/2001 | Seely et al. |
| 6,254,105 B1 | 7/2001 | Rinde et al. |
| 6,278,490 B1 | 8/2001 | Fukuda et al. |
| 6,305,073 B1 | 10/2001 | Badders |
| 6,329,617 B1 | 12/2001 | Burgess |
| 6,344,791 B1 | 2/2002 | Armstrong |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,511,378 B1 | 1/2003 | Bhatt et al. |
| 6,532,035 B1 | 3/2003 | Saari et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,574,030 B1 | 6/2003 | Mosier |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,700,617 B1 | 3/2004 | Hamamura et al. |
| 6,704,864 B1 | 3/2004 | Philyaw |
| 6,721,019 B2 | 4/2004 | Kono et al. |
| 6,725,318 B1 | 4/2004 | Sherman et al. |
| 6,753,920 B1 | 6/2004 | Momose et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,798,887 B1 | 9/2004 | Andre |
| 6,813,143 B2 | 11/2004 | Makela |
| 6,819,316 B2 | 11/2004 | Schulz et al. |
| 6,856,506 B2 | 2/2005 | Doherty et al. |
| 6,856,789 B2 | 2/2005 | Pattabiraman et al. |
| 6,859,565 B2 | 2/2005 | Baron |
| 6,861,961 B2 | 3/2005 | Sandbach et al. |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,976,799 B2 | 12/2005 | Kim et al. |
| 7,002,624 B1 | 2/2006 | Uchino et al. |
| 7,007,238 B2 | 2/2006 | Glaser |
| 7,091,436 B2 | 8/2006 | Serban |
| 7,099,149 B2 | 8/2006 | Krieger et al. |
| 7,102,683 B2 | 9/2006 | Perry et al. |
| 7,106,222 B2 | 9/2006 | Ward et al. |
| 7,123,292 B1 | 10/2006 | Seeger et al. |
| 7,129,979 B1 | 10/2006 | Lee |
| D535,292 S | 1/2007 | Shi et al. |
| 7,159,132 B2 | 1/2007 | Takahashi et al. |
| 7,162,153 B2 | 1/2007 | Harter, Jr. et al. |
| 7,194,662 B2 | 3/2007 | Do et al. |
| 7,213,323 B2 | 5/2007 | Baker et al. |
| 7,213,991 B2 | 5/2007 | Chapman et al. |
| 7,252,512 B2 | 8/2007 | Tai et al. |
| 7,260,221 B1 | 8/2007 | Atsmon |
| 7,277,087 B2 | 10/2007 | Hill et al. |
| 7,295,720 B2 | 11/2007 | Raskar |
| 7,301,759 B2 | 11/2007 | Hsiung |
| 7,365,967 B2 | 4/2008 | Zheng |
| 7,379,094 B2 | 5/2008 | Yoshida et al. |
| 7,400,452 B2 | 7/2008 | Detro et al. |
| 7,415,676 B2 | 8/2008 | Fujita |
| 7,443,443 B2 | 10/2008 | Raskar et al. |
| 7,447,922 B1 | 11/2008 | Asbury et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,509,042 B2 | 3/2009 | Mori et al. |
| 7,539,882 B2 | 5/2009 | Jessup et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,594,638 B2 | 9/2009 | Chan et al. |
| 7,629,966 B2 | 12/2009 | Anson |
| 7,636,921 B2 | 12/2009 | Louie |
| 7,639,329 B2 | 12/2009 | Takeda et al. |
| 7,656,392 B2 | 2/2010 | Bolender |
| 7,722,358 B2 | 5/2010 | Chatterjee et al. |
| 7,724,952 B2 | 5/2010 | Shum et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,777,972 B1 | 8/2010 | Chen et al. |
| 7,782,342 B2 | 8/2010 | Koh |
| 7,813,715 B2 | 10/2010 | McKillop et al. |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,927,654 B2 | 4/2011 | Hagood et al. |
| 7,928,964 B2 | 4/2011 | Kolmykov-Zotov et al. |
| 7,932,890 B2 | 4/2011 | Onikiri et al. |
| 7,944,520 B2 | 5/2011 | Ichioka et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,016,255 B2 | 9/2011 | Lin |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,421 B2 | 5/2012 | Wright et al. |
| 8,179,236 B2 | 5/2012 | Weller et al. |
| 8,184,190 B2 | 5/2012 | Dosluoglu |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,464,079 B2 | 6/2013 | Chueh et al. |
| 8,498,100 B1 | 7/2013 | Whitt, III et al. |
| 8,514,568 B2 | 8/2013 | Qiao et al. |

(56) References Cited

U.S. PATENT DOCUMENTS

| | | |
|---|---|---|
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,587,701 B2 * | 11/2013 | Tatsuzawa ............... 348/246 |
| 8,599,542 B1 | 12/2013 | Healey et al. |
| 8,610,015 B2 | 12/2013 | Whitt et al. |
| 8,614,666 B2 | 12/2013 | Whitman et al. |
| 8,633,898 B2 | 1/2014 | Westerman et al. |
| 8,646,999 B2 | 2/2014 | Shaw et al. |
| 8,674,941 B2 | 3/2014 | Casparian et al. |
| 8,699,215 B2 | 4/2014 | Whitt, III et al. |
| 8,719,603 B2 | 5/2014 | Belesiu |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,786,767 B2 | 7/2014 | Rihn et al. |
| 8,791,382 B2 | 7/2014 | Whitt, III et al. |
| 8,797,765 B2 | 8/2014 | Lin et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,964,376 B2 | 2/2015 | Chen |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 2001/0023818 A1 | 9/2001 | Masaru et al. |
| 2002/0005108 A1 | 1/2002 | Ludwig |
| 2002/0044216 A1 * | 4/2002 | Cha ............... 348/376 |
| 2002/0070883 A1 | 6/2002 | Dosch |
| 2002/0113882 A1 | 8/2002 | Pollard et al. |
| 2002/0134828 A1 | 9/2002 | Sandbach et al. |
| 2002/0135457 A1 | 9/2002 | Sandbach et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0011576 A1 | 1/2003 | Sandbach et al. |
| 2003/0036365 A1 | 2/2003 | Kuroda |
| 2003/0044216 A1 | 3/2003 | Fang |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0128285 A1 | 7/2003 | Itoh |
| 2003/0160712 A1 | 8/2003 | Levy |
| 2003/0163611 A1 | 8/2003 | Nagao |
| 2003/0197687 A1 | 10/2003 | Shetter |
| 2003/0197806 A1 | 10/2003 | Perry et al. |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0113956 A1 | 6/2004 | Bellwood et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0189822 A1 | 9/2004 | Shimada |
| 2004/0212598 A1 | 10/2004 | Kraus et al. |
| 2004/0212601 A1 | 10/2004 | Cake et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 * | 3/2005 | Satake et al. ............... 396/301 |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0068460 A1 | 3/2005 | Lin |
| 2005/0094895 A1 | 5/2005 | Baron |
| 2005/0099400 A1 | 5/2005 | Lee |
| 2005/0134717 A1 | 6/2005 | Misawa |
| 2005/0146512 A1 | 7/2005 | Hill et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2006/0049920 A1 | 3/2006 | Sadler et al. |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102020 A1 | 5/2006 | Takada et al. |
| 2006/0125799 A1 | 6/2006 | Hillis et al. |
| 2006/0154725 A1 | 7/2006 | Glaser et al. |
| 2006/0155391 A1 * | 7/2006 | Pistemaa et al. ............... 700/17 |
| 2006/0156415 A1 | 7/2006 | Rubinstein et al. |
| 2006/0174143 A1 | 8/2006 | Sawyers et al. |
| 2006/0176377 A1 * | 8/2006 | Miyasaka ............... 348/222.1 |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0220465 A1 | 10/2006 | Kingsmore et al. |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 * | 1/2007 | Shibutani ............... 396/123 |
| 2007/0024742 A1 | 2/2007 | Raskar et al. |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0081091 A1 | 4/2007 | Pan et al. |
| 2007/0117600 A1 | 5/2007 | Robertson et al. |
| 2007/0121956 A1 | 5/2007 | Bai et al. |
| 2007/0127205 A1 | 6/2007 | Kuo |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0201859 A1 | 8/2007 | Sarrat |
| 2007/0220708 A1 | 9/2007 | Lewis |
| 2007/0222766 A1 | 9/2007 | Bolender |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0252674 A1 * | 11/2007 | Nelson et al. ............... 340/5.53 |
| 2007/0260892 A1 | 11/2007 | Paul et al. |
| 2007/0263119 A1 | 11/2007 | Shum et al. |
| 2007/0283179 A1 | 12/2007 | Burnett et al. |
| 2007/0296709 A1 | 12/2007 | Guanghai |

(56) References Cited

U.S. PATENT DOCUMENTS

| | | |
|---|---|---|
| 2007/0297625 A1 | 12/2007 | Hjort et al. |
| 2008/0001924 A1 | 1/2008 | de los Reyes et al. |
| 2008/0019684 A1 | 1/2008 | Shyu et al. |
| 2008/0042978 A1 | 2/2008 | Perez-Noguera |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0074398 A1 | 3/2008 | Wright |
| 2008/0084499 A1 | 4/2008 | Kisacanin et al. |
| 2008/0104437 A1 | 5/2008 | Lee |
| 2008/0106592 A1 | 5/2008 | Mikami |
| 2008/0129520 A1 | 6/2008 | Lee |
| 2008/0151478 A1 | 6/2008 | Chern |
| 2008/0158185 A1 | 7/2008 | Westerman |
| 2008/0174570 A1 | 7/2008 | Jobs et al. |
| 2008/0177185 A1 | 7/2008 | Nakao et al. |
| 2008/0186660 A1 | 8/2008 | Yang |
| 2008/0203277 A1 | 8/2008 | Warszauer et al. |
| 2008/0228969 A1 | 9/2008 | Cheah et al. |
| 2008/0238884 A1 | 10/2008 | Harish |
| 2008/0253822 A1 | 10/2008 | Matias |
| 2008/0307242 A1 | 12/2008 | Qu |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0089600 A1 | 4/2009 | Nousiainen |
| 2009/0096756 A1 | 4/2009 | Lube |
| 2009/0102805 A1 | 4/2009 | Meijer et al. |
| 2009/0131134 A1 | 5/2009 | Baerlocher et al. |
| 2009/0140985 A1 | 6/2009 | Liu |
| 2009/0147102 A1 | 6/2009 | Kakinuma et al. |
| 2009/0158221 A1 | 6/2009 | Nielsen et al. |
| 2009/0160944 A1 | 6/2009 | Trevelyan et al. |
| 2009/0167930 A1 | 7/2009 | Safaee-Rad et al. |
| 2009/0174759 A1 | 7/2009 | Yeh et al. |
| 2009/0177906 A1 | 7/2009 | Paniagua, Jr. et al. |
| 2009/0189873 A1 | 7/2009 | Peterson |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0231465 A1 | 9/2009 | Senba |
| 2009/0239586 A1 | 9/2009 | Boeve et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0284613 A1 | 11/2009 | Kim |
| 2009/0285491 A1 | 11/2009 | Ravenscroft et al. |
| 2009/0296331 A1 | 12/2009 | Choy |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |
| 2010/0006412 A1 | 1/2010 | Wang et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045633 A1 | 2/2010 | Gettemy et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0083108 A1 | 4/2010 | Rider et al. |
| 2010/0085321 A1 | 4/2010 | Pundsack |
| 2010/0100752 A1 | 4/2010 | Chueh et al. |
| 2010/0102182 A1 | 4/2010 | Lin |
| 2010/0103112 A1 | 4/2010 | Yoo et al. |
| 2010/0103332 A1 | 4/2010 | Li et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128427 A1 | 5/2010 | Iso |
| 2010/0133398 A1 | 6/2010 | Chiu et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149104 A1 | 6/2010 | Sim et al. |
| 2010/0149111 A1 | 6/2010 | Olien |
| 2010/0149377 A1 | 6/2010 | Shintani et al. |
| 2010/0156913 A1 | 6/2010 | Ortega et al. |
| 2010/0157085 A1 | 6/2010 | Sasaki |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171875 A1 | 7/2010 | Yamamoto |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0185877 A1 | 7/2010 | Chueh et al. |
| 2010/0188299 A1 | 7/2010 | Rinehart et al. |
| 2010/0201308 A1 | 8/2010 | Lindholm |
| 2010/0205472 A1 | 8/2010 | Tupman et al. |
| 2010/0206614 A1 | 8/2010 | Park et al. |
| 2010/0207774 A1 | 8/2010 | Song |
| 2010/0220205 A1 | 9/2010 | Lee et al. |
| 2010/0222110 A1 | 9/2010 | Kim et al. |
| 2010/0231522 A1 | 9/2010 | Li |
| 2010/0235546 A1 | 9/2010 | Terlizzi et al. |
| 2010/0238320 A1 | 9/2010 | Washisu |
| 2010/0238620 A1 | 9/2010 | Fish |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315345 A1 | 12/2010 | Laitinen |
| 2010/0315348 A1 | 12/2010 | Jellicoe et al. |
| 2010/0315373 A1 | 12/2010 | Steinhauser et al. |
| 2010/0321877 A1 | 12/2010 | Moser |
| 2010/0324457 A1 | 12/2010 | Bean et al. |
| 2010/0325155 A1 | 12/2010 | Skinner et al. |
| 2011/0012866 A1 | 1/2011 | Keam |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0050576 A1 | 3/2011 | Forutanpour et al. |
| 2011/0050626 A1 | 3/2011 | Porter et al. |
| 2011/0050946 A1 | 3/2011 | Lee et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0074688 A1 | 3/2011 | Hull et al. |

(56) References Cited

U.S. PATENT DOCUMENTS

| | | |
|---|---|---|
| 2011/0081946 A1 | 4/2011 | Singh et al. |
| 2011/0102326 A1 | 5/2011 | Casparian et al. |
| 2011/0102752 A1 | 5/2011 | Chen et al. |
| 2011/0107958 A1 | 5/2011 | Pance et al. |
| 2011/0108401 A1 | 5/2011 | Yamada et al. |
| 2011/0113368 A1 | 5/2011 | Carvajal et al. |
| 2011/0115738 A1 | 5/2011 | Suzuki et al. |
| 2011/0117970 A1 | 5/2011 | Choi |
| 2011/0134032 A1 | 6/2011 | Chiu et al. |
| 2011/0134043 A1 | 6/2011 | Chen |
| 2011/0157037 A1 | 6/2011 | Shamir et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0169762 A1 | 7/2011 | Weiss |
| 2011/0176035 A1 | 7/2011 | Poulsen |
| 2011/0179864 A1 | 7/2011 | Raasch et al. |
| 2011/0181754 A1 | 7/2011 | Iwasaki |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0199389 A1 | 8/2011 | Lu et al. |
| 2011/0205372 A1 | 8/2011 | Miramontes |
| 2011/0221659 A1 | 9/2011 | King et al. |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0234494 A1 | 9/2011 | Peterson et al. |
| 2011/0234881 A1 | 9/2011 | Wakabayashi et al. |
| 2011/0241999 A1 | 10/2011 | Thier |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261209 A1 | 10/2011 | Wu |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0285555 A1 | 11/2011 | Bocirnea |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1* | 12/2011 | Maglaque ............... 348/143 |
| 2011/0302518 A1 | 12/2011 | Zhang |
| 2011/0304577 A1 | 12/2011 | Brown et al. |
| 2011/0305875 A1 | 12/2011 | Sanford et al. |
| 2011/0316807 A1 | 12/2011 | Corrion |
| 2011/0320204 A1 | 12/2011 | Locker et al. |
| 2012/0002052 A1 | 1/2012 | Muramatsu et al. |
| 2012/0002820 A1 | 1/2012 | Leichter |
| 2012/0007821 A1 | 1/2012 | Zaliva |
| 2012/0008015 A1 | 1/2012 | Manabe |
| 2012/0019686 A1 | 1/2012 | Manabe |
| 2012/0020490 A1 | 1/2012 | Leichter |
| 2012/0020556 A1 | 1/2012 | Manabe |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026096 A1 | 2/2012 | Ku |
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0038495 A1 | 2/2012 | Ishikawa |
| 2012/0044179 A1 | 2/2012 | Hudson |
| 2012/0044379 A1 | 2/2012 | Manabe |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0062736 A1 | 3/2012 | Xiong |
| 2012/0068919 A1 | 3/2012 | Lauder et al. |
| 2012/0069540 A1 | 3/2012 | Lauder et al. |
| 2012/0075249 A1 | 3/2012 | Hoch |
| 2012/0077384 A1 | 3/2012 | Bar-Niv et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113137 A1 | 5/2012 | Nomoto |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0133797 A1 | 5/2012 | Sato et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0156875 A1 | 6/2012 | Srinivas et al. |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0194448 A1 | 8/2012 | Rothkopf |
| 2012/0212438 A1 | 8/2012 | Vaisanen |
| 2012/0218194 A1 | 8/2012 | Silverman |
| 2012/0221877 A1 | 8/2012 | Prabu |
| 2012/0224073 A1 | 9/2012 | Miyahara |
| 2012/0229634 A1 | 9/2012 | Laett et al. |
| 2012/0242584 A1 | 9/2012 | Tuli |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256959 A1 | 10/2012 | Ye et al. |
| 2012/0260177 A1 | 10/2012 | Sehrer |
| 2012/0274811 A1 | 11/2012 | Bakin |
| 2012/0281129 A1 | 11/2012 | Wang et al. |
| 2012/0287218 A1 | 11/2012 | Ok |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2012/0330162 A1 | 12/2012 | Rajan et al. |
| 2013/0009413 A1 | 1/2013 | Chiu et al. |
| 2013/0015311 A1 | 1/2013 | Kim |
| 2013/0021289 A1 | 1/2013 | Chen et al. |
| 2013/0027867 A1 | 1/2013 | Lauder et al. |
| 2013/0031353 A1 | 1/2013 | Noro |
| 2013/0038541 A1 | 2/2013 | Bakker |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076617 A1 | 3/2013 | Csaszar et al. |
| 2013/0082824 A1 | 4/2013 | Colley |
| 2013/0088431 A1 | 4/2013 | Ballagas et al. |
| 2013/0100030 A1 | 4/2013 | Los et al. |
| 2013/0100082 A1 | 4/2013 | Bakin et al. |
| 2013/0106766 A1 | 5/2013 | Yilmaz et al. |
| 2013/0128102 A1 | 5/2013 | Yano |
| 2013/0135214 A1 | 5/2013 | Li et al. |
| 2013/0151944 A1 | 6/2013 | Lin |
| 2013/0154959 A1 | 6/2013 | Lindsay et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0212483 A1 | 8/2013 | Brakensiek et al. |
| 2013/0215035 A1 | 8/2013 | Guard |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0222681 A1 | 8/2013 | Wan |
| 2013/0226794 A1 | 8/2013 | Englebardt |
| 2013/0227836 A1 | 9/2013 | Whitt, III |

(56) References Cited

U.S. PATENT DOCUMENTS

| | | |
|---|---|---|
| 2013/0228023 A1 | 9/2013 | Drasnin |
| 2013/0228433 A1 | 9/2013 | Shaw |
| 2013/0228434 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III et al. |
| 2013/0229363 A1 | 9/2013 | Whitman |
| 2013/0229366 A1 | 9/2013 | Dighde |
| 2013/0229380 A1 | 9/2013 | Lutz, III |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0262886 A1 | 10/2013 | Nishimura |
| 2013/0268897 A1 | 10/2013 | Li et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2013/0342976 A1 | 12/2013 | Chung |
| 2014/0012401 A1 | 1/2014 | Perek |
| 2014/0043275 A1 | 2/2014 | Whitman et al. |
| 2014/0048399 A1 | 2/2014 | Whitt, III |
| 2014/0055624 A1 | 2/2014 | Gaines |
| 2014/0085814 A1 | 3/2014 | Kielland |
| 2014/0119802 A1 | 5/2014 | Shaw |
| 2014/0125864 A1 | 5/2014 | Rihn |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0313401 A1 | 10/2014 | Rihn et al. |
| 2014/0362506 A1 | 12/2014 | Whitt, III et al. |
| 2014/0372914 A1 | 12/2014 | Byrd et al. |
| 2014/0379942 A1 | 12/2014 | Perek et al. |
| 2015/0005953 A1 | 1/2015 | Fadell et al. |
| 2015/0036274 A1 | 2/2015 | Belesiu et al. |
| 2015/0227212 A1 | 8/2015 | Whitt, III et al. |
| 2015/0234478 A1 | 8/2015 | Belesiu et al. |
| 2015/0261262 A1 | 9/2015 | Whitt, III et al. |
| 2015/0311014 A1 | 10/2015 | Shaw et al. |
| 2015/0312453 A1 | 10/2015 | Gaines et al. |

FOREIGN PATENT DOCUMENTS

| | | |
|---|---|---|
| CN | 1537223 | 10/2004 |
| CN | 1787605 | 6/2006 |
| CN | 1808362 | 7/2006 |
| CN | 101366001 | 2/2009 |
| CN | 101452334 | 6/2009 |
| CN | 101644979 | 2/2010 |
| CN | 101675406 | 3/2010 |
| CN | 101681189 | 3/2010 |
| CN | 102004559 | 4/2011 |
| CN | 1102012763 | 4/2011 |
| CN | 102112947 | 6/2011 |
| CN | 102117121 | 7/2011 |
| CN | 102138113 | 7/2011 |
| CN | 102147643 | 8/2011 |
| CN | 102214040 | 10/2011 |
| CN | 102292687 | 12/2011 |
| CN | 102356624 | 2/2012 |
| CN | 103455097 | 12/2013 |
| CN | 103455149 | 12/2013 |
| DE | 10116556 | 10/2002 |
| EP | 645726 | 3/1995 |
| EP | 1003188 | 5/2000 |
| EP | 1223722 | 7/2002 |
| EP | 1480029 | 11/2004 |
| EP | 1591891 | 11/2005 |
| EP | 1983411 | 10/2008 |
| EP | 2006869 | 12/2008 |
| EP | 2026178 | 2/2009 |
| EP | 2353978 | 8/2011 |
| EP | 2410408 | 1/2012 |
| GB | 2068643 | 8/1981 |
| GB | 2123213 | 1/1984 |
| GB | 2305780 | 4/1997 |
| GB | 2381584 | 5/2003 |
| GB | 2482932 | 2/2012 |
| JP | 52107722 | 9/1977 |
| JP | 56108127 | 8/1981 |
| JP | H104540 | 1/1998 |
| JP | 10326124 | 12/1998 |
| JP | 1173239 | 3/1999 |
| JP | 11338575 | 12/1999 |
| JP | 2000010654 | 1/2000 |
| JP | 2001142564 | 5/2001 |
| JP | 2002170458 | 6/2002 |
| JP | 2002300438 | 10/2002 |
| JP | 2004038950 | 2/2004 |
| JP | 3602207 | 12/2004 |
| JP | 2006160155 | 6/2006 |
| JP | 2006163459 | 6/2006 |
| JP | 2006294361 | 10/2006 |
| JP | 2010244514 | 10/2010 |
| JP | 2003077368 | 3/2014 |
| KR | 20010107055 | 12/2001 |
| KR | 20050014299 | 2/2005 |
| KR | 20060003093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 102011008717 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO-9919995 | 4/1999 |
| WO | WO-0072079 | 11/2000 |
| WO | WO-2006044818 | 4/2006 |
| WO | WO-2007112172 | 10/2007 |
| WO | WO-2009034484 | 3/2009 |
| WO | WO-2010147609 | 12/2010 |
| WO | WO-2011049609 | 4/2011 |
| WO | WO-2014084872 | 6/2014 |

OTHER PUBLICATIONS

"Final Office Action", U.S. Appl. No. 13/471,001, (Jul. 25, 2013), 20 pages.

(56) References Cited

OTHER PUBLICATIONS

"Final Office Action", U.S. Appl. No. 13/471,336, (Aug. 28, 2013), 18 pages.
"Final Office Action", U.S. Appl. No. 13/651,976, (Jul. 25, 2013), 21 pages.
"Final Office Action", U.S. Appl. No. 13/653,321, (Aug. 2, 2013), 17 pages.
"Non-Final Office Action", U.S. Appl. No. 13/527,263, (Jul. 19, 2013), 5 pages.
"Non-Final Office Action", U.S. Appl. No. 13/651,871, (Jul. 1, 2013), 5 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"Notice of Allowance", U.S. Appl. No. 13/651,195, (Jul. 8, 2013), 9 pages.
"Notice of Allowance", U.S. Appl. No. 13/651,304, (Jul. 1, 2013), 5 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Advisory Action", U.S. Appl. No. 13/939,032, Feb. 24, 2014, 2 pages.
"International Search Report and Written Opinion", Application No. PCT/US2013/053683, Nov. 28, 2013, 11 pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,405, Feb. 20, 2014, 37 pages.
"Non-Final Office Action", U.S. Appl. No. 13/564,520, Feb. 14, 2014, 5 pages.
"Non-Final Office Action", U.S. Appl. No. 13/653,682, Feb. 26, 2014, 10 pages.
"Notice of Allowance", U.S. Appl. No. 13/938,930, Feb. 20, 2014, 4 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Final Office Action", U.S. Appl. No. 13/780,228, Mar. 28, 2014, 13 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"International Search Report and Written Opinion", Application No. PCT/US2013/067912, Feb. 13, 2014, 12 pages.
"Non-Final Office Action", U.S. Appl. No. 13/471,237, Mar. 24, 2014, 7 pages.
"Non-Final Office Action", U.S. Appl. No. 13/471,376, Apr. 2, 2014, 17 pages.
"Non-Final Office Action", U.S. Appl. No. 13/527,263, Apr. 3, 2014, 6 pages.
"Non-Final Office Action", U.S. Appl. No. 13/656,055, Mar. 12, 2014, 17 pages.
"Notice of Allowance", U.S. Appl. No. 13/471,139, Mar. 17, 2014, 4 pages.
"Notice of Allowance", U.S. Appl. No. 13/667,408, Mar. 13, 2014, 11 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Non-Final Office Action", U.S. Appl. No. 14/063,912, Jan. 2, 2014, 10 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice of Allowance", U.S. Appl. No. 13/653,321, Dec. 18, 2013, 4 pages.
"Foreign Office Action", CN Application No. 201320097066.8, Oct. 24, 2013, 5 Pages.
"Non-Final Office Action", U.S. Appl. No. 13/939,002, Dec. 20, 2013, 5 pages.
"Final Office Action", U.S. Appl. No. 13/939,032, Dec. 20, 2013, 5 pages.
"Restriction Requirement", U.S. Appl. No. 13/468,918, Nov. 29, 2013, 6 pages.
"Notice of Allowance", U.S. Appl. No. 13/565,124, Dec. 24, 2013, 6 pages.
"Final Office Action", U.S. Appl. No. 13/564,520, Jan. 15, 2014, 7 pages.
"Cirago Slim Case®—Protective case with built-in kickstand for your iPhone 5®", Retrieved from <http://cirago.com/wordpress/wp-content/uploads/2012/10/ipc1500brochure1.pdf>on Jan. 29, 2013, 1 page.
"Non-Final Office Action", U.S. Appl. No. 13/471,001, (Feb. 19, 2013), 15 pages.
"Non-Final Office Action", U.S. Appl. No. 13/471,139, (Mar. 21, 2013), 12 pages.
"Non-Final Office Action", U.S. Appl. No. 13/471,202, (Feb. 11, 2013), 10 pages.
"Non-Final Office Action", U.S. Appl. No. 13/471,336, (Jan. 18, 2013), 14 pages.
"Non-Final Office Action", U.S. Appl. No. 13/651,195, (Jan. 2, 2013), 14 pages.
"Non-Final Office Action", U.S. Appl. No. 13/651,232, (Jan. 17, 2013), 15 pages.
"Non-Final Office Action", U.S. Appl. No. 13/651,272, (Feb. 12, 2013), 10 pages.
"Non-Final Office Action", U.S. Appl. No. 13/651,287, (Jan. 29, 2013), 13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,871, (Mar. 18, 2013), 14 pages.
"Non-Final Office Action", U.S. Appl. No. 13/651,976, (Feb. 22, 2013), 16 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Notice of Allowance", U.S. Appl. No. 13/470,633, (Mar. 22, 2013), 7 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.

(56) References Cited

OTHER PUBLICATIONS

"The Microsoft Surface Tablets Comes With Impressive Design and Specs", Retrieved from <http://microsofttabletreview.com/the-microsoft-surface-tablets-comes-with-impressive-desiqn-and-specs> on Jan. 30, 2013, (Jun. 2012), 2 pages.
"Tilt Shift Lenses: Perspective Control", retrieved from. http://www.cambridgeincolour.com/tutorials/tilt-shift-lenses1.htm, (Mar. 28, 2008), 11 Pages.
"What is Active Alignment?", http://www.kasalis.com/active_alignment.html, retrieved on Nov. 22, 2012, 2 Pages.
"Advanced Configuration and Power Management Specification", *Intel Corporation, Microsoft Corporation, Toshiba Corp. Revision 1*, (Dec. 22, 1996), 364 pages.
"Corrected Notice of Allowance", U.S. Appl. No. 13/651 327 (Sep. 12, 2013), 2 pages.
"Corrected Notice of Allowance", U.S. Appl. No. 13/651,327, (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,139, (Sep. 16, 2013), 13 pages.
"Final Office Action", U.S. Appl. No. 13/653,682, (Oct. 18, 2013), 16 pages.
"Final Office Action", U.S. Appl. No. 13/656,055, (Oct. 23, 2013), 14 pages.
"Final Office Action", U.S. Appl. No. 13/938,930, (Nov. 8, 2013), 10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013), 12 pages.
"International Search Report and Written Opinion", Application No. PCT/US2013/042550, (Sep. 24, 2013), 14 pages.
"Non-Final Office Action", U.S. Appl. No. 13/780,228, (Oct. 30, 2013), 12 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"Welcome to Windows 7", Retrieved from: <http://www.microsoft.com/en-us/download/confirmation.aspx?id=4984> on Aug. 1, 2013, (Sep. 16, 2009), 3 pages.
Prospero, Michael "Samsung Outs Series 5 Hybrid PC Tablet", Retrieved from:<http://blog.laptopmag.com/samsung-outs-series-5-hybrid-pc-tablet-running-windows-8> on Oct. 31, 2013, (Jun. 4, 2012), 7 pages.
"Accessing Device Sensors", retrieved from <https://developer.palm.com/content/api/dev-guide/pdk/accessing-device-sensors.html> on May 25, 2012, 4 pages.
"First One Handed Fabric Keyboard with Bluetooth Wireless Technology", Retrieved from: <http://press.xtvworld.com/article3817.html> on May 8, 2012,(Jan. 6, 2005), 2 pages.
"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.
"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developer.android.com/guide/topics/sensors_motion.html> on May 25, 2012, 7 pages.
"Position Sensors", *Android Developers*, retrieved from <http://developers.android.com/guide/topics/sensors_position.html> on May 25, 2012, 5 pages.
"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
Block, Steve et al., "DeviceOrientation Event Specification", *W3C, Editors Draft*, retrieved from <https://developer.palm.com/content/api/dev-guide/pdk/accessing-device-sensors.html> on May 25, 2012,(Jul. 12, 2011), 14 pages.
Brown, Rich "Microsoft Shows Off Pressure-Sensitive Keyboard", retrieved from <http://news.cnet.com/9301-17938_105-10304792-1.html> on May 7, 2012, (Aug. 6, 2009), 2 pages.
Buler, Alex et al., "SideSight: Multi-"touch" Interaction around Small Devices", *In the proceedings of the 21st annual ACM symposium on User Interface software and technology.*, retrieved from <http://research.microsoft.com/pubs/132534/sidesight_crv3.pdf> on May 29, 2012,(Oct. 19, 2008), 4 pages.
Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.
Dietz, Paul H., et al., "A Practical Pressure Sensitive Computer Keyboard", In Proceedings of UIST 2009,(Oct. 2009), 4 pages.
Glatt, Jeff "Channel and Key Pressure (Aftertouch).", Retrieved from: <http://home.roadrunner.com/~jgglatt/tutr/touch.htm> on Jun. 11, 2012, 2 pages.
Hanlon, Mike "ElekTex Smart Fabric Keyboard Goes Wireless", Retrieved from: <http://www.gizmag.com/go/5048/ > on May 7, 2012,(Jan. 15, 2006), 5 pages.
Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.
Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.
Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.
McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.
Post, E.R. et al., "E-Broidery: Design and Fabrication of Textile-Based Computing", IBM Systems Journal, vol. 39, Issue 3 & 4,(Jul. 2000), pp. 840-860.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.
Takamatsu, Seiichi et al., "Flexible Fabric Keyboard with Conductive Polymer-Coated Fibers", In Proceedings of Sensors 2011,(Oct. 28, 2011), 4 pages.
Zhang, et al., "Model-Based Development of Dynamically Adaptive Software", *In Proceedings of ICSE 2006*, Available at <http://www.irisa.fr/lande/lande/icse-proceedings/icse/p371.pdf>, (May 20, 2006), pp. 371-380.
"Corrected Notice of Allowance", U.S. Appl. No. 13/470,633, (Apr. 9, 2013), 2 pages.
"Final Office Action", U.S. Appl. No. 13/651,195, (Apr. 18, 2013), 13 pages.

(56) References Cited

OTHER PUBLICATIONS

"Final Office Action", U.S. Appl. No. 13/651,232, (May 21, 2013), 21 pages.
"Final Office Action", U.S. Appl. No. 13/651,287, (May 3, 2013), 16 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 18, 2013), 5 pages.
"Non-Final Office Action", U.S. Appl. No. 13/651,726, (Apr. 15, 2013), 6 pages.
"Non-Final Office Action", U.S. Appl. No. 13/653,682, (Jun. 3, 2013), 14 pages.
"Non-Final Office Action", U.S. Appl. No. 13/656,055, (Apr. 23, 2013), 11 pages.
"Notice of Allowance", U.S. Appl. No. 13/471,202, (May 28, 2013), 7 pages.
"Notice of Allowance", U.S. Appl. No. 13/651,272, (May 2, 2013), 7 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
Jacobs, et al., "2D/3D Switchable Displays", *In the proceedings of Sharp Technical Journal* (4), Available at <https://cgi.sharp.co.jp/corporate/rd/journal-85/pdf/85-04.pdf>,(Apr. 2003), pp. 15-18.
Morookian, et al., "Ambient-Light-Canceling Camera Using Subtraction of Frames", *NASA Tech Briefs*, Retrieved from <http://ntrs.nasa.gov/archive/nasa/casi.ntrs.nasa.gov/20110016693_2011017808.pdf>,(May 2004), 2 pages.
"Advisory Action", U.S. Appl. No. 14/199,924, May 28, 2014, 2 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 13/667,408, Jun. 24, 2014, 9 pages.
"Corrected Notice of Allowance", U.S. Appl. No. 13/938,930, May 6, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,002, May 5, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"Final Office Action", U.S. Appl. No. 13/653,682, Jun. 11, 2014, 11 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Notice of Allowance", CN Application No. 201320096755.7, Jan. 27, 2014, 2 pages.
"Foreign Office Action", CN Application No. 201320097065.3, Jun. 18, 2013, 2 pages.
"Foreign Office Action", CN Application No. 201320097079.5, Sep. 26, 2013, 4 pages.
"Interlink Electronics FSR (TM) Force Sensing Resistors (TM)", Retrieved at <<http://akizukidenshi.com/download/ds/interlinkelec/94-00004+Rev+B%20FSR%201ntegration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/468,882, Jul. 9, 2014, 9 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,282, Sep. 3, 2014, 13 pages.
"Non-Final Office Action", U.S. Appl. No. 13/471,336, May 7, 2014, 17 pages.
"Non-Final Office Action", U.S. Appl. No. 13/471,412, Jul. 11, 2014, 22 pages.
"Non-Final Office Action", U.S. Appl. No. 13/492,232, Apr. 30, 2014, 9 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.

(56) References Cited

OTHER PUBLICATIONS

"Non-Final Office Action", U.S. Appl. No. 13/651,976, Jun. 16, 2014, 23 pages.
"Non-Final Office Action", U.S. Appl. No. 14/063,912, Sep. 2, 2014, 11 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,186, Jul. 3, 2014, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Restriction Requirement", U.S. Appl. No. 13/595,700, May 28, 2014, 6 pages.
"Supplemental Notice of Allowance", U.S. Appl. No. 13/471,405, Aug. 29, 2014, 5 pages.
"Supplemental Notice of Allowance", U.S. Appl. No. 14/018,286, Jun. 11, 2014, 5 pages.
"Corrected Notice of Allowance", U.S. Appl. No. 13/471,030, Sep. 30, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"Final Office Action", U.S. Appl. No. 13/468,949, Oct. 6, 2014, 11 pages.
"Final Office Action", U.S. Appl. No. 13/471,336, Oct. 6, 2014, 13 pages.
"Final Office Action", U.S. Appl. No. 13/492,232, Nov. 17, 2014, 13 pages.
"Final Office Action", U.S. Appl. No. 13/595,700, Oct. 9, 2014, 8 pages.
"Final Office Action", U.S. Appl. No. 13/656,055, Sep. 17, 2014, 10 pages.
"Final Office Action", U.S. Appl. No. 14/200,595, Nov. 19, 2014, 5 pages.
"International Search Report and Written Opinion", Application No. PCT/US2014/043546, Oct. 9, 2014, 10 pages.
"Non-Final Office Action", U.S. Appl. No. 13/471,393, Oct. 20, 2014, 12 pages.
"Non-Final Office Action", U.S. Appl. No. 13/525,614, Nov. 24, 2014, 19 pages.
"Non-Final Office Action", U.S. Appl. No. 13/780,228, Sep. 15, 2014, 18 pages.
"Non-Final Office Action", U.S. Appl. No. 14/325,247, Nov. 17, 2014, 15 pages.
"Notice of Allowance", U.S. Appl. No. 13/471,030, Sep. 5, 2014, 6 pages.
"Notice of Allowance", U.S. Appl. No. 13/653,682, Sep. 24, 2014, 4 pages.
"Notice of Allowance", U.S. Appl. No. 14/277,240, Sep. 16, 2014, 4 pages.
"Restriction Requirement", U.S. Appl. No. 13/593,066, Oct. 8, 2014, 8 pages.
"Restriction Requirement", U.S. Appl. No. 14/147,252, Dec. 1, 2014, 6 pages.
"Restriction Requirement", U.S. Appl. No. 14/325,247, Oct. 6, 2014, 6 pages.
Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.
"Corrected Notice of Allowance", U.S. Appl. No. 14/277,240, Jan. 8, 2015, 2 pages.
"Final Office Action", U.S. Appl. No. 13/470,951, Jan. 12, 2015, 20 pages.
"Final Office Action", U.S. Appl. No. 13/471,412, Dec. 15, 2014, 11 pages.
"Final Office Action", U.S. Appl. No. 13/527,263, Jan. 27, 2015, 7 pages.
"Final Office Action", U.S. Appl. No. 14/063,912, Jan. 12, 2015, 12 pages.
"Final Office Action", U.S. Appl. No. 14/225,276, Dec. 17, 2014, 6 pages.
"First Examination Report", NZ Application No. 628690, Nov. 27, 2014, 2 pages.
"Foreign Office Action", CN Application No. 201320097079.5, Jul. 28, 2014, 4 pages.
"Non-Final Office Action", U.S. Appl. No. 13/471,030, Jan. 15, 2015, 7 pages.
"Non-Final Office Action", U.S. Appl. No. 13/564,520, Jan. 26, 2015, 6 pages.
"Non-Final Office Action", U.S. Appl. No. 13/593,066, Jan. 2, 2015, 11 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Supplemental Notice of Allowance", U.S. Appl. No. 13/471,405, Dec. 17, 2014, 5 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.
"Corrected Notice of Allowance", U.S. Appl. No. 14/200,595, Jun. 4, 2015, 3 pages.
"Final Office Action", U.S. Appl. No. 13/468,882, Feb. 12, 2015, 9 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Final Office Action", U.S. Appl. No. 14/325,247, Apr. 16, 2015, 21 pages.
"Foreign Notice on Reexamination", CN Application No. 201320097066.8, Apr. 3, 2015, 7 Pages.
"Foreign Office Action", CN Application No. 201310067808.7, May 28, 2015, 14 Pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/471,412, Jun. 1, 2015, 31 pages.
"Non-Final Office Action", U.S. Appl. No. 13/492,232, Feb. 24, 2015, 12 pages.
"Non-Final Office Action", U.S. Appl. No. 13/599,635, Feb. 12, 2015, 16 pages.
"Non-Final Office Action", U.S. Appl. No. 13/852,848, Mar. 26, 2015, 7 pages.
"Non-Final Office Action", U.S. Appl. No. 14/059,280, Mar. U.S. Appl. 3, 2015, 18 pages.

(56) References Cited

OTHER PUBLICATIONS

"Non-Final Office Action", U.S. Appl. No. 14/063,912, May 7, 2015, 12 pages.
"Non-Final Office Action", U.S. Appl. No. 14/147,252, Feb. 23, 2015, 11 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,030, Apr. 6, 2015, 6 pages.
"Notice of Allowance", U.S. Appl. No. 13/471,282, Apr. 30, 2015, 8 pages.
"Notice of Allowance", U.S. Appl. No. 13/564,520, May 8, 2015, 4 pages.
"Notice of Allowance", U.S. Appl. No. 13/651,232, Mar. 30, 2015, 7 pages.
"Notice of Allowance", U.S. Appl. No. 13/656,055, Mar. 4, 2015, 7 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/656,055, May 15, 2015, 2 pages.
Schafer, "Using Interactive Maps for Navigation and Collaboration", CHI '01 Extended Abstracts on Human Factors in Computing Systems, Mar. 31, 2001, 2 pages.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 13/852,848, Jul. 20, 2015, 9 pages.
"Final Office Action", U.S. Appl. No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"Non-Final Office Action", U.S. Appl. No. 13/471,336, Jun. 24, 2015, 15 pages.
"Non-Final Office Action", U.S. Appl. No. 13/525,614, Jul. 31, 2015, 20 pages.
"Non-Final Office Action", U.S. Appl. No. 14/727,001, Jul. 10, 2015, 7 pages.
"Notice of Allowance", U.S. Appl. No. 14/225,276, Jun. 22, 2015, 4 pages.
"Notice of Allowance", U.S. Appl. No. 14/457,881, Jul. 22, 2015, 7 pages.
"Supplemental Notice of Allowance", U.S. Appl. No. 13/656,055, Jun. 10, 2015, 2 pages.
Cunningham, "Software Infrastructure for Natural Language Processing", In Proceedings of the fifth conference on Applied natural language processing, Mar. 31, 1997, pp. 237-244.
"Advisory Action", U.S. Appl. No. 13/471,376, Sep. 23, 2015, 7 pages.
"Advisory Action", U.S. Appl. No. 14/059,280, Sep. 25, 2015, 7 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 13/564,520, Sep. 17, 2015, 2 pages.
"Corrected Notice of Allowance", U.S. Appl. No. 14/225,276, Aug. 27, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Aug. 20, 2015, 2 pages.
"Corrected Notice of Allowance", U.S. Appl. No. 14/457,881, Oct. 2, 2015, 2 pages.
"Decision on Reexamination", CN Application No. 201320097079.5, Sep. 7, 2015, 8 Pages.
"Extended European Search Report", EP Application No. 13858620.1, Sep. 18, 2015, 6 pages.
"Extended European Search Report", EP Application No. 13859280.3, Sep. 7, 2015, 6 pages.
"Extended European Search Report", EP Application No. 13859406.4, Sep. 8, 2015, 6 pages.
"Final Office Action", U.S. Appl. No. 13/689,541, Nov. 2, 2015, 21 pages.
"Final Office Action", U.S. Appl. No. 14/063,912, Sep. 3, 2015, 13 pages.
"Foreign Office Action", CN Application No. 201310067385.9, Aug. 6, 2015, 16 pages.
"Foreign Office Action", CN Application No. 201310067592.4, Oct. 23, 2015, 12 Pages.
"Foreign Office Action", CN Application No. 201310067627.4, Sep. 28, 2015, 14 pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/470,951, Oct. 1, 2015, 29 pages.
"Non-Final Office Action", U.S. Appl. No. 13/471,393, Sep. 30, 2015, 15 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Non-Final Office Action", U.S. Appl. No. 14/225,250, Aug. 19, 2015, 9 pages.
"Non-Final Office Action", U.S. Appl. No. 14/225,276, Aug. 19, 2015, 9 pages.
"Notice of Allowance", U.S. Appl. No. 14/727,001, Oct. 2, 2015, 4 pages.
"Supplemental Notice of Allowance", U.S. Appl. No. 13/468,918, Aug. 7, 2015, 4 pages.
"Supplemental Notice of Allowance", U.S. Appl. No. 13/468,949, Sep. 14, 2015, 2 pages.
"Foreign Office Action", CN Application No. 201310067631.0, Dec. 10, 2015, 10 Pages.
"Extended European Search Report", EP Application No. 13858283.8, Nov. 23, 2015, 10 pages.

(56) References Cited

OTHER PUBLICATIONS

"Extended European Search Report", EP Application No. 13858397.6, Nov. 30, 2015, 7 pages.

"Extended European Search Report", EP Application No. 13858674.8, Nov. 27, 2015, 6 pages.

"Extended European Search Report", EP Application No. 13858834.8, Oct. 29, 2015, 8 pages.

"Extended European Search Report", EP Application No. 13860272.7, Dec. 14, 2015, 9 pages.

"Extended European Search Report", EP Application No. 13861292.4, Nov. 23, 2015, 7 pages.

"Final Office Action", U.S. Appl. No. 13/471,336, Dec. 10, 2015, 17 pages.

"Foreign Office Action", CN Application No. 201310065273.X, Oct. 28, 2015, 14 pages.

"Foreign Office Action", CN Application No. 201310067429.8, Nov. 25, 2015, 12 Pages.

"Foreign Office Action", CN Application No. 201310067622.1, Oct. 27, 2015, 14 pages.

"Non-Final Office Action", U.S. Appl. No. 13/468,882, Nov. 13, 2015, 9 pages.

"Notice of Allowance", U.S. Appl. No. 13/471,376, Nov. 23, 2015, 9 pages.

"Notice of Allowance", U.S. Appl. No. 13/471,412, Nov. 20, 2015, 10 pages.

"Notice of Allowance", U.S. Appl. No. 13/527,263, Dec. 9, 2015, 6 pages.

"Notice of Allowance", U.S. Appl. No. 13/852,848, Nov. 19, 2015, 4 pages.

"Notice of Allowance", U.S. Appl. No. 14/059,280, Nov. 23, 2015, 9 pages.

"Supplementary European Search Report", EP Application No. 13728568.0, Oct. 30, 2015, 7 pages.

\* cited by examiner

DEVICE CAMERA ANGLE

RELATED APPLICATIONS

This application claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,311, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on.

Many mobile computing devices include an integrated camera. Such devices are typically held at a particular angle in order for an integrated camera to capture an image. Thus, images can be cut-off or out-of-focus if the device is not held or positioned at the correct angle relative to an object being photographed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for device camera angle are described. In one or more implementations, a computing device includes a kickstand that can support the computing device on a surface. For example, kickstand can be opened to a particular position, and the computing device can be positioned on a surface (e.g., a table, a desk, and so on) such that a user can interact with the computing device. A user, for instance, can provide input to the computing device via an attached input device. Further, a user can view and/or interact with a display device included on the computing device.

In at least some embodiments, a camera is mounted in a computing device at an angle based on an orientation of the computing device. For example, when the computing device is positioned on a surface and at an angle to the surface (such as when supported by a kickstand), the mounting angle of the camera is such that the camera points forward, and not towards the surface. For instance, consider a scenario where the computing device is placed on a table in a room at a preset angle supported by a kickstand, such that a user sitting at the table can view a display on the computing device. The camera can be mounted in the computing device on a surface opposite the display device, such that the field of view of the camera points away from the display device. Further, the camera is mounted at an angle in the computing device such that the user can capture images (e.g., still images, video, and so on) of objects in the room, such as other persons sitting at the table, a whiteboard on a wall, and so forth. Thus, the field of view of the camera can be perpendicular to the table such that the camera is not simply pointing down at the table. In implementations, this can provide a "tripod experience" whereby a computing device that includes a camera can be supported by a kickstand, and the camera is angled such that images of surrounding objects can be captured, e.g., recorded.

In at least some implementations, a computing device includes a camera that is physically adjustable independent of the computing device to support different orientations of the computing device. Components of the camera, for instance, can be tilted, rotated, and/or panned based on a detected orientation of the computing device. This can enable a field of view of the camera to be adjusted to enable images of objects to be captured in different orientations of the computing device.

In at least some implementations, images that are captured via a camera on a computing device can be manipulated based on an orientation of the computing device. For example, various types of image enhancement and/or image correction can be applied to image data to account for phenomena that may arise when images are captured at particular angles, such as low light, image distortion, and so on.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
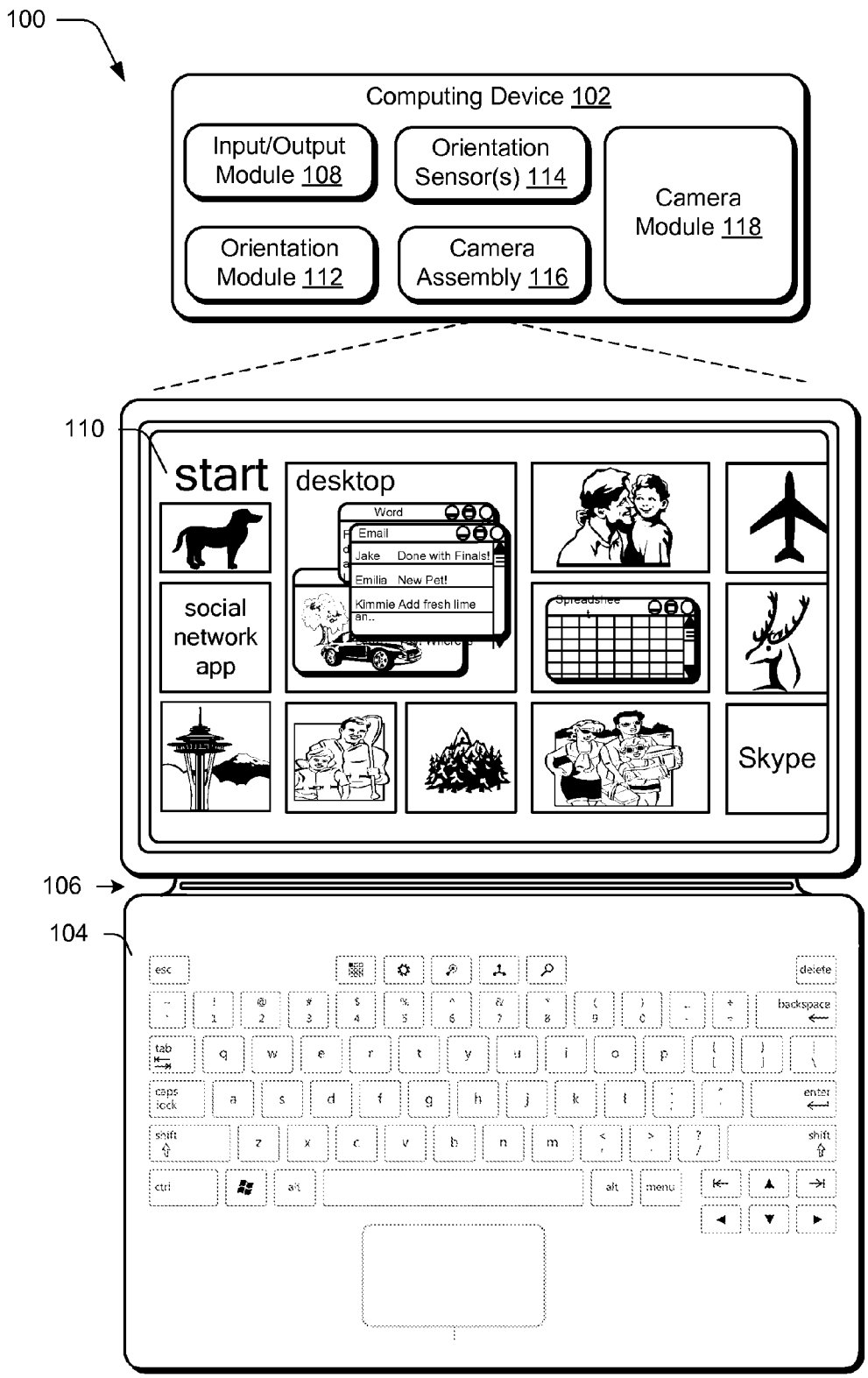
FIG. 1 is an illustration of an environment in an example implementation that is operable to employ the techniques described herein.

Techniques for device camera angle are described. In one or more implementations, a computing device includes a kickstand that can support the computing device on a surface. For example, kickstand can be opened to a particular position, and the computing device can be positioned on a surface (e.g., a table, a desk, and so on) such that a user can interact with the computing device. A user, for instance, can provide input to the computing device via an attached input device. Further, a user can view and/or interact with a display device included on the computing device.

In at least some embodiments, a camera is mounted in a computing device at an angle based on an orientation of the computing device. For example, when the computing device is positioned on a surface and at an angle to the surface (such as when supported by a kickstand), the mounting angle of the camera is such that the camera points forward, and not towards the surface. For instance, consider a scenario where the computing device is placed on a table in a room at a preset angle supported by a kickstand, such that a user sitting at the table can view a display on the computing device. The camera can be mounted in the computing device on a surface opposite the display device, such that the field of view of the camera points away from the display device. Further, the camera is mounted at an angle in the computing device such that the user can capture images (e.g., still images, video, and so on) of objects in the room, such as other persons sitting at the table, a whiteboard on a wall, and so forth. Thus, the field of view of the camera can be perpendicular to the table such that the camera is not simply pointing down at the table. In implementations, this can provide a "tripod experience" whereby a computing device that includes a camera can be supported by a kickstand, and the camera is angled such that images of surrounding objects can be captured, e.g., recorded.

In at least some implementations, a computing device includes a camera that is physically adjustable to support different orientations of the computing device. Components of the camera, for instance, can be tilted, rotated, and/or panned based on a detected orientation of the computing device. This can enable a field of view of the camera to be adjusted to enable images of objects to be captured in different orientations of the computing device.

In at least some implementations, images that are captured via a camera on a computing device can be manipulated based on an orientation of the computing device. For example, various types of image enhancement and/or correction can be applied to image data to account for phenomena that may arise when images are captured at particular angles, such as low light, image distortion, and so on.

In the following discussion, an example environment is first described that may employ techniques described herein. Next, a section entitled "Example Device Orientations" describes some example mobile device orientations in accordance with one or more embodiments. Following this, a section entitled "Example Camera Assembly" describes some example camera assemblies and camera components in accordance with one or more embodiments. Next, an example procedure is described which may be performed in the example environment as well as other environments. Consequently, performance of the example procedure is not limited to the example environment and the example environment is not limited to performance of the example procedure. Finally, an example system and device are described in which embodiments may be implemented in accordance with one or more embodiments. Further, although an input device is described, other devices are also contemplated that do not include input functionality, such as covers.

Example Environment

FIG. 1 is an illustration of an environment 100 in an example implementation that is operable to employ techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by a display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of way in accordance with one or more embodiments.

The computing device 102 further includes an orientation module 112, which is representative of functionality to determine a positional orientation of the computing device 102. For example, the orientation module 112 can utilize orientation information received from one or more orientation sensors 114. The orientation sensors 114 are representative of functionality to detect types of orientation information for the computing device 102, such as angles relative to gravity, relative tilt, angle relative to earth's magnetic field, and so forth. Examples of the orientation sensors 114 include an accelerometer, magnetometer, tilt sensor, inclinometer, and so on. A variety of other types of orientation sensors may additionally or alternatively be employed, however.

The orientation module 112 can utilize the orientation information to determine a relative orientation of the computing device 102. The relative orientation, for instance, can indicate an angle at which the computing device 102 is tilted, such as with reference to the ground, e.g., earth's gravitational field. Orientation information can be leveraged to perform various tasks, examples of which are discussed above and below.

A camera assembly 116 is included, which is representative of functionality to record images, such as still images, video, and so on. The camera assembly 116 can include various image capture components, such as a lens, a mirror, an electronic image sensor, and so on. The camera assembly 116 can also include structural components employed to mount image capture components into the computing device 102, such as a component carrier in which the image capture components can be installed. The component carrier can enable the image capture components to be securely mounted in the computing device 102. In at least some embodiments, the component carrier can also enable various adjustments to be made to angles at which images are captured, as detailed below.

The computing device 102 also includes a camera module 118, which is representative of functionality to perform various operations related to image capture and image adjustment. The camera module 118 can also cause adjustments to be made to various components of the camera assembly 116. The camera module 118, for instance, can utilize orientation information received from the orientation module 112 and/or the orientation sensors 114. The camera module 118 can leverage the orientation information to perform various operations, such as adjusting components of the camera assembly 116 to account for orientation of the computing device 102, image manipulation based on orientation of the computing device 102, and so forth. Examples of such operations are detailed below.

Figure 2:
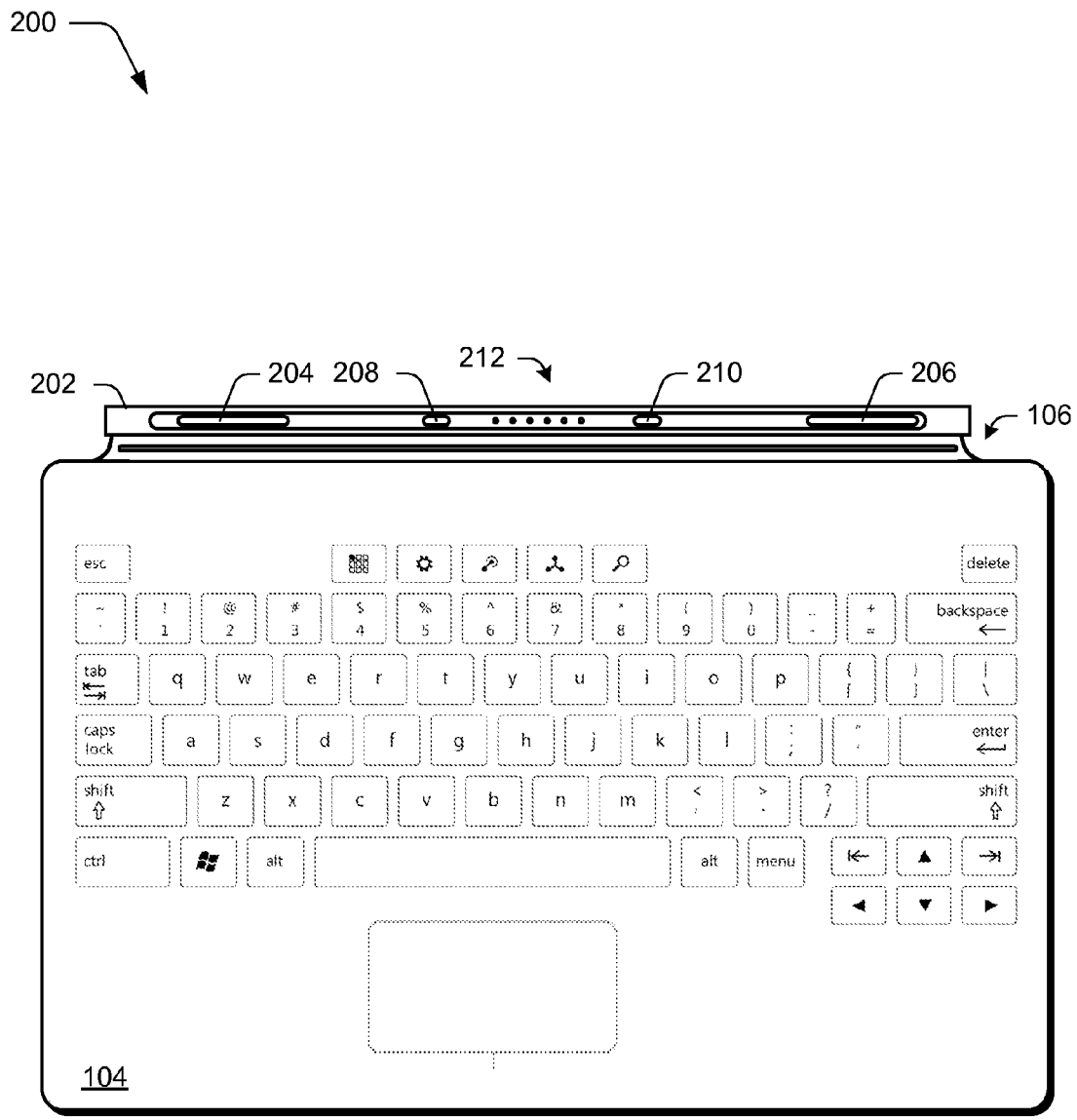
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

The connection portion 202 is illustrated in this example as including magnetic coupling devices 204, 206, mechanical coupling protrusions 208, 210, and communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The communication contacts 212 are configured to contact corresponding communication contacts of the computing device 102 to form a communicative coupling between the devices as shown.

Having discussed an example environment in which embodiments may operate, consider now some example device orientations in accordance with one or more embodiments.

Example Device Orientations

The following discussion presents some example device orientations in accordance with various embodiments.

Figure 3:
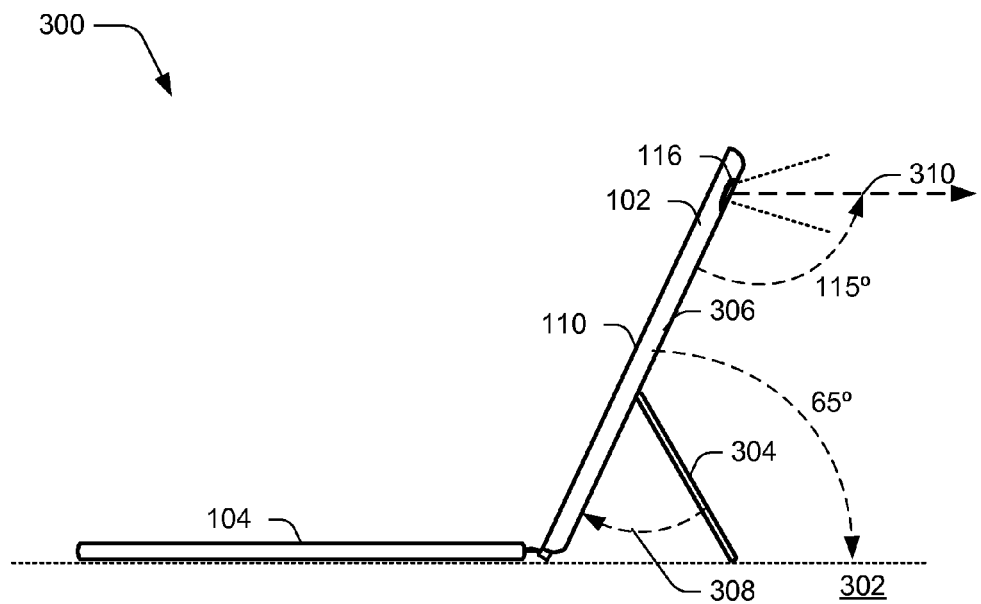
FIG. 3 depicts an example orientation of the computing device in accordance with one or more embodiments.

FIG. 3 illustrates an example orientation 300 of the computing device 102. In the orientation 300, the input device 104 is laid flat against a surface 302 and the computing device 102 is disposed at an angle to permit viewing of the display device 110, e.g., such as through use of a kickstand 304 disposed on a rear surface of the computing device 102. The orientation 300 can correspond to a typing arrangement whereby input can be received via the input device 104, such as using keys of the keyboard, a track pad, and so forth. For instance, the surface 302 can correspond to any suitable surface on which the computing device 102 and/or the input device 104 can be placed, such as a desk, a table, a floor, and so forth.

In at least some embodiments, the kickstand 304 can be configured to open to various preset positions. The preset positions, for instance, can correspond to angles with reference to a rear surface 306 of the computing device 102. In the illustrated example, the kickstand 304 is open to a preset position that corresponds to an angle 308 with reference to the rear surface 306. The angle 308 can be selected from a range of different angles. The angle 308, for instance, can include an angle between 20 degrees to 30 degrees (20°-30°).

Further to the example illustrated in FIG. 3, the computing device 102 includes the camera assembly 116. As mentioned above, the camera assembly 116 can include various components, such as a lens, a sensor, mirrors, a prism, and so forth. In at least some implementations, a field of view of the camera assembly faces away from the display device 110, such that a user who is interacting with the computing device 102 and/or the input device 104 can capture images of objects that the user is facing.

In at least some implementations, components of the camera assembly 116 can be mounted in the computing device 102 at an angle based on a tilt angle of the computing device 102. For instance, components of the camera assembly 116 can be mounted at an angle such that when the computing device is placed in the orientation 300, a field of view of the camera assembly 116 is substantially perpendicular to the surface 302, e.g., within 10 degrees (10°). The angle of the camera assembly 116, for example, can be such that in the orientation 300, an optical axis 310 of the camera assembly 116 is substantially parallel (e.g., within 10 degrees (10°)) to the surface 302.

For example, consider that the angle 308 of the kickstand 304 is such that the rear surface 306 is at an angle of 65 degrees (65°) to the surface 302. In this example, the camera assembly 116 can be angled in the computing device 102 such that the optical axis 310 is at an angle of 115 degrees to the rear surface 306 to enable the optical axis to be substantially parallel to the surface 302. Thus, in at least some embodiments, the camera assembly 116 can be mounted at an angle such that an angle of the optical axis 310 with respect to the rear surface 306 is supplementary to an angle of the rear surface 306 with respect to the surface 302.

Figure 4:
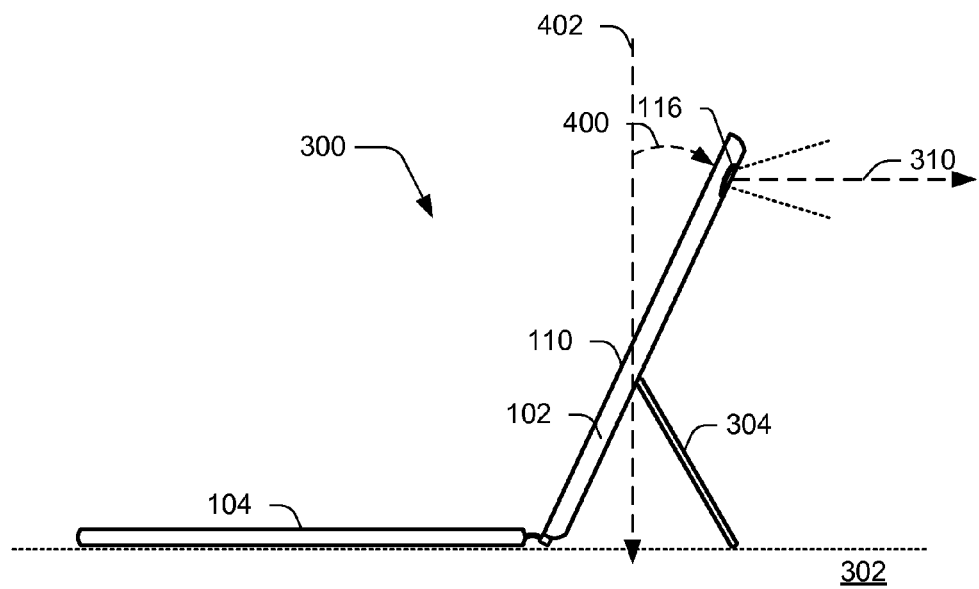
FIG. 4 depicts an example orientation of the computing device in accordance with one or more embodiments.

Additionally or alternatively, the camera assembly 116 can be adjustable to compensate for various orientations and/or angles of the computing device 102. For instance, consider the example illustrated in FIG. 4, where the computing device 102 is positioned in the orientation 300 discussed above.

In this example, an orientation of the computing device 102 is determined. For example, the orientation sensors 114 can detect that the computing device 102 is tilted at an angle 400 with reference to gravity, e.g., a gravitational vector 402. The orientation module 112 can receive this orientation information from the orientation sensors 114, and can perform various operations based on the orientation information. For instance, the orientation module 112 can cause one or more components of the camera assembly 116 to be physically adjusted based on the angle 400. The orientation module 112, for example, can cause one or more components of the camera assembly 116 to be tilted, panned, and so forth, such that the optical axis 310 is perpendicular to the gravitational vector 402. Additionally or alternatively, a variety of other adjustments can be made as well within the spirit and scope of the disclosed embodiments.

Components of the camera assembly 116 may also be adjustable based on an angle of the kickstand 304. For instance, the orientation module 112 can detect that the kickstand 304 is opened to a particular position. A hinge assembly that enables rotation of the kickstand 304, for example, can include a sensor mechanism that can detect an angle at which the kickstand 304 is disposed. Based on position of the kickstand 304, components of the camera assembly 116 can be tilted, panned, and so forth.

Orientation information can also be leveraged to perform various types of image processing. For instance, the camera module 118 can receive orientation information from the orientation module 112 and/or the orientation sensors 114. The camera module 118 can use the orientation information to perform image processing on a captured image, such as image correction to compensate for image distortion caused by an angle of the camera assembly 116 to an object being captured.

Figure 5:
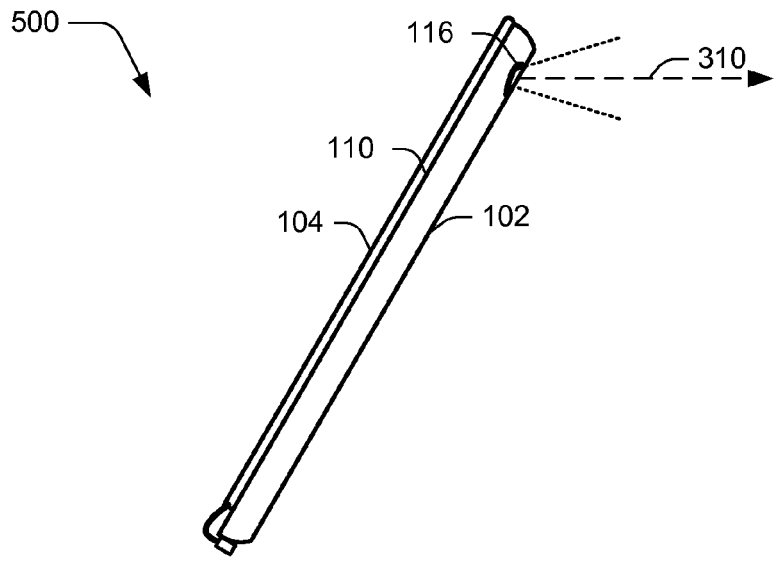
FIG. 5 depicts an example orientation of the computing device in accordance with one or more embodiments.

FIG. 5 illustrates that the input device 104 may be rotated such that the input device 104 is placed against the display device 110 of the computing device 102 to assume an orientation 500. In the orientation 500, the input device 104 may act as a cover such that the input device 104 can protect the display device 110 from harm. In implementations, the orientation 500 can correspond to a closed position of the computing device 102.

In the orientation 500, while the display device 110 may not be visible, the camera assembly 116 may nonetheless be used to capture images of objects. Further, techniques discussed herein may be employed to determine an orientation of the computing device 102, and to adjust the camera assembly 116 and/or images based on the orientation.

Figure 6:
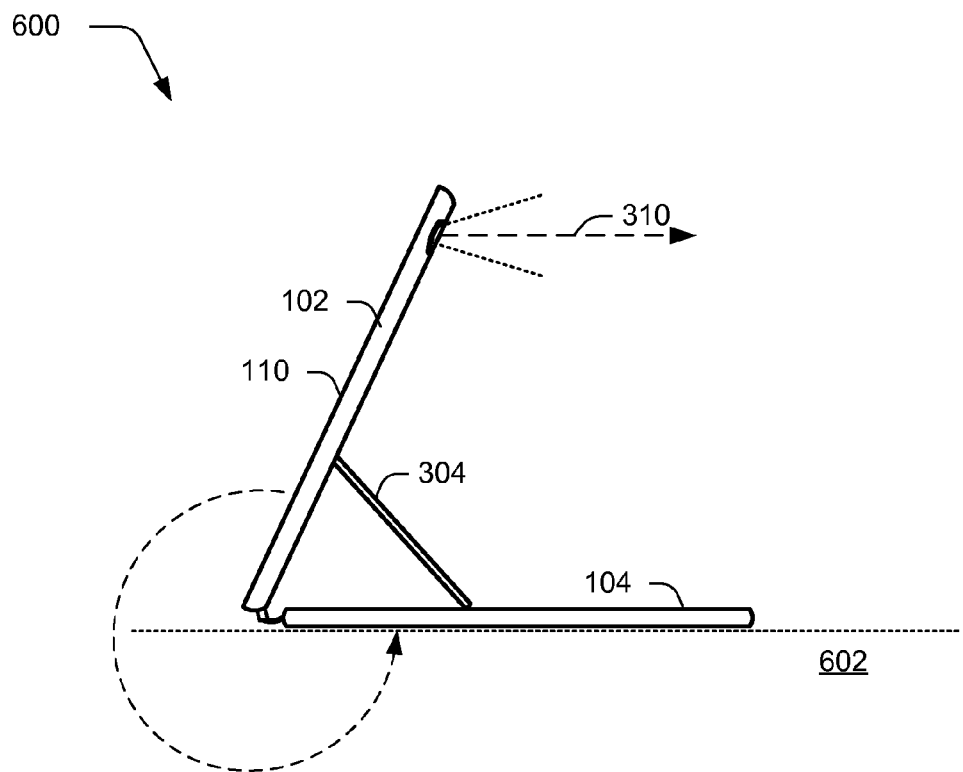
FIG. 6 depicts an example orientation of the computing device in accordance with one or more embodiments.

FIG. 6 illustrates a further example orientation of the computing device 102, generally at 600. In the orientation 600, the computing device 102 is placed on a surface 602 and is oriented such that the display device 110 faces away from the input device 104. In this example, the kickstand 304 can support the computing device 102, such as via contact with a back surface of the input device 104. Although not expressly illustrated here, a cover can be employed to cover and protect a front surface of the input device 104 from the surface 602.

Further to the example illustrated in FIG. 6, the camera assembly 116 can be angled as discussed above. For example, the camera assembly 116 can be angled such that the optical axis 310 is parallel to the surface 602. Additionally or alternatively, an orientation of the computing device 102 can be determined and leveraged to adjust components of the camera assembly 116, to perform image processing, and so forth.

Figure 7:
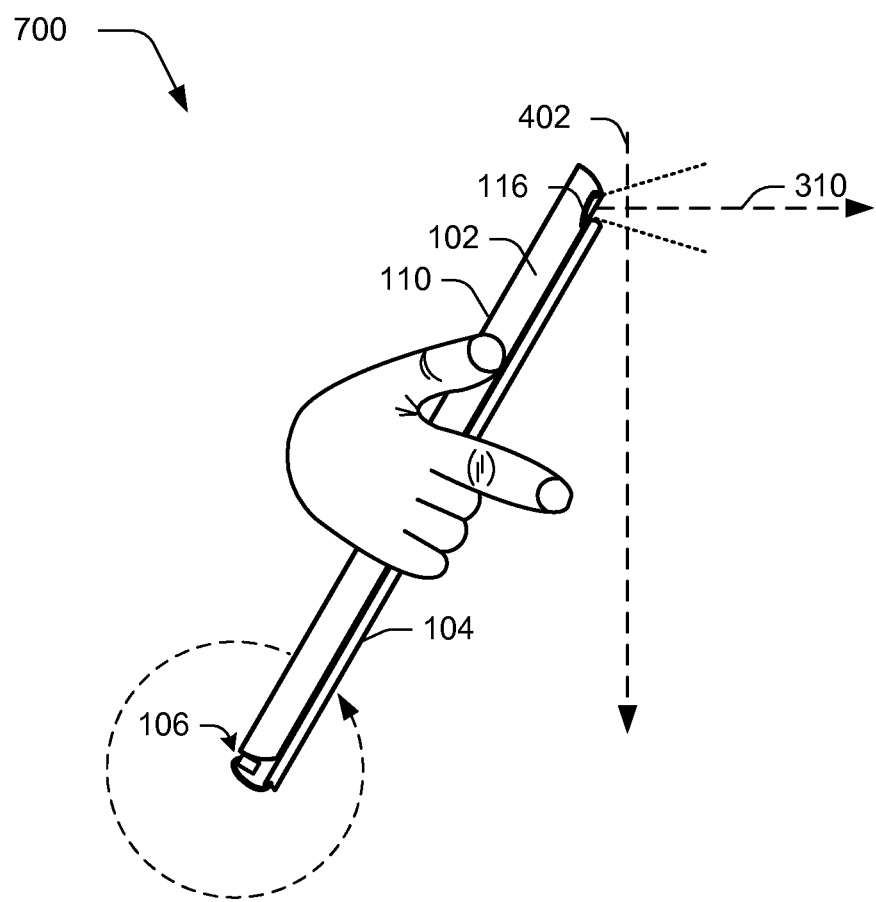
FIG. 7 depicts an example orientation of the computing device in accordance with one or more embodiments.

FIG. 7 illustrates an example orientation 700, in which the input device 104 may also be rotated so as to be disposed against a back of the computing device 102, e.g., against a rear housing of the computing device 102 that is disposed opposite the display device 110 on the computing device 102. In this example, the flexible hinge 106 is caused to "wrap around" to position the input device 104 at the rear of the computing device 102.

This wrapping causes a portion of a rear of the computing device 102 to remain exposed. This may be leveraged for a variety of functionality, such as to permit the camera assembly 116 to be used even though a significant portion of the rear of the computing device 102 is covered by the input device 104.

The orientation 700 can enable a variety of uses for the computing device 102. For instance, the orientation 700 can correspond to a handheld position of the computing device. In the handheld position, a user can grasp the computing device 102 in the orientation 700, and use the computing device to capture images of objects via the camera assembly 116. Thus, a user can point the camera assembly 116 toward an object to cause an image of the object to be displayed via the display device 110. The user can then activate functionality of the camera assembly 116 to capture an image of the object, such as by actuating a touch screen button displayed on the display device 110, pressing a button on the computing device 102 and/or the input device 104, and so on. Thus, the display device 110 can function as a preview display for images that can be captured via the camera assembly 116.

Further to the example illustrated in FIG. 7, the camera assembly 116 can be angled as discussed above. For example, the camera assembly 116 can be angled such that the optical axis 310 is parallel to the ground, perpendicular to the gravitational vector 402, and so on. Additionally or alternatively, an orientation of the computing device 102 can be determined and leveraged to adjust components of the camera assembly 116, to perform image processing, and so forth.

The example orientations discussed above are presented for purpose of example only, and techniques discussed herein can be implemented to enable images to be captured in a wide variety of different device orientations. Further, although the camera assembly 116 is illustrated in a particular position and orientation with reference to the computing device 102, this is not intended to be limiting. The camera assembly 116 can be oriented in a wide variety of different positions on the computing device 102 within the spirit and scope of the claimed embodiments. In at least some embodiments, for instance, the camera assembly 116 can include a front facing camera, e.g., a camera whose field of view faces the same direction as the display device 110. Further, the computing device 102 can employ multiple cameras that can capture different fields of view, e.g., multiple implementations of the camera assembly 116. For instance, both a front facing and a rear facing camera can be employed.

Having discussed some example device orientations, consider now some example camera assemblies in accordance with one or more embodiments.

Example Camera Assembly

Figure 8:
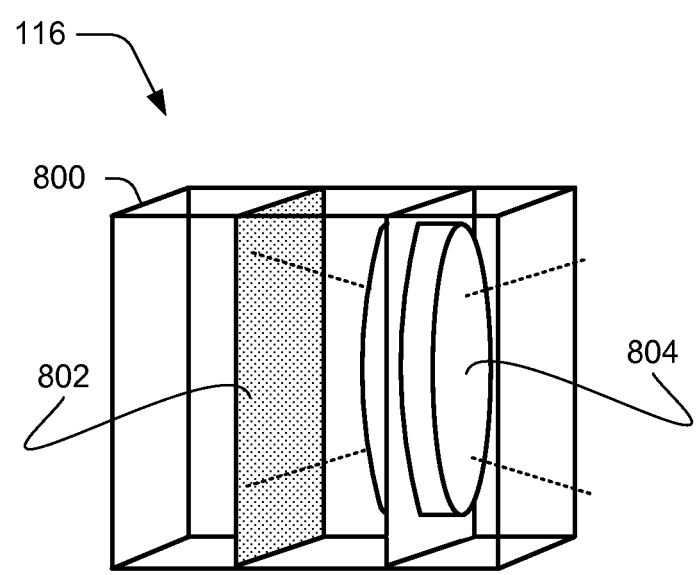
FIG. 8 depicts an example camera assembly in accordance with one or more embodiments.

FIG. 8 illustrates an example implementation of the camera assembly 116. Included as part of the camera assembly 116 are a carrier 800, which contains a sensor 802 and an optical intake 804. The carrier 800 is a mechanism that contains components of the camera assembly 116, and enables the components to be mounted in various configurations in the computing device 102. In implementations, the carrier 800 can be adjustably mounted in the computing device 102, such that the carrier 800 can be tilted, panned, rotated, and so forth. For example, the carrier 800 can be attached to a motor assembly that enables adjustment of the carrier 800 and/or components of the camera assembly 116 within the computing device 102.

The sensor 802 is representative of a device that can receive an optical image, and can convert the optical image into an electronic signal. Examples of the sensor 802 include a digital charge-coupled device (CCD), a complementary metal-oxide-semiconductor (CMOS) active pixel sensor, and so forth. Images converted by the sensor 802 can be utilized by other components and/or functionalities of the computing device 102, such as displayed via the display device 110, stored in memory, and so forth.

The optical intake 804 receives light externally from the computing device 102, and focuses the light on the sensor 802 to form an optical image on the sensor 802. The optical intake 804 can include a variety of components, such as different configurations and/or combinations of a lens, a prism, a mirror, and so forth. In at least some embodiments, the optical intake 804 is configured to focus light on particular portions of the sensor 802. Which portion of the sensor 802 can depend on an angle at which the computing device 102 is tilted, the camera carrier 800 is tilted, and so forth.

Figure 9:
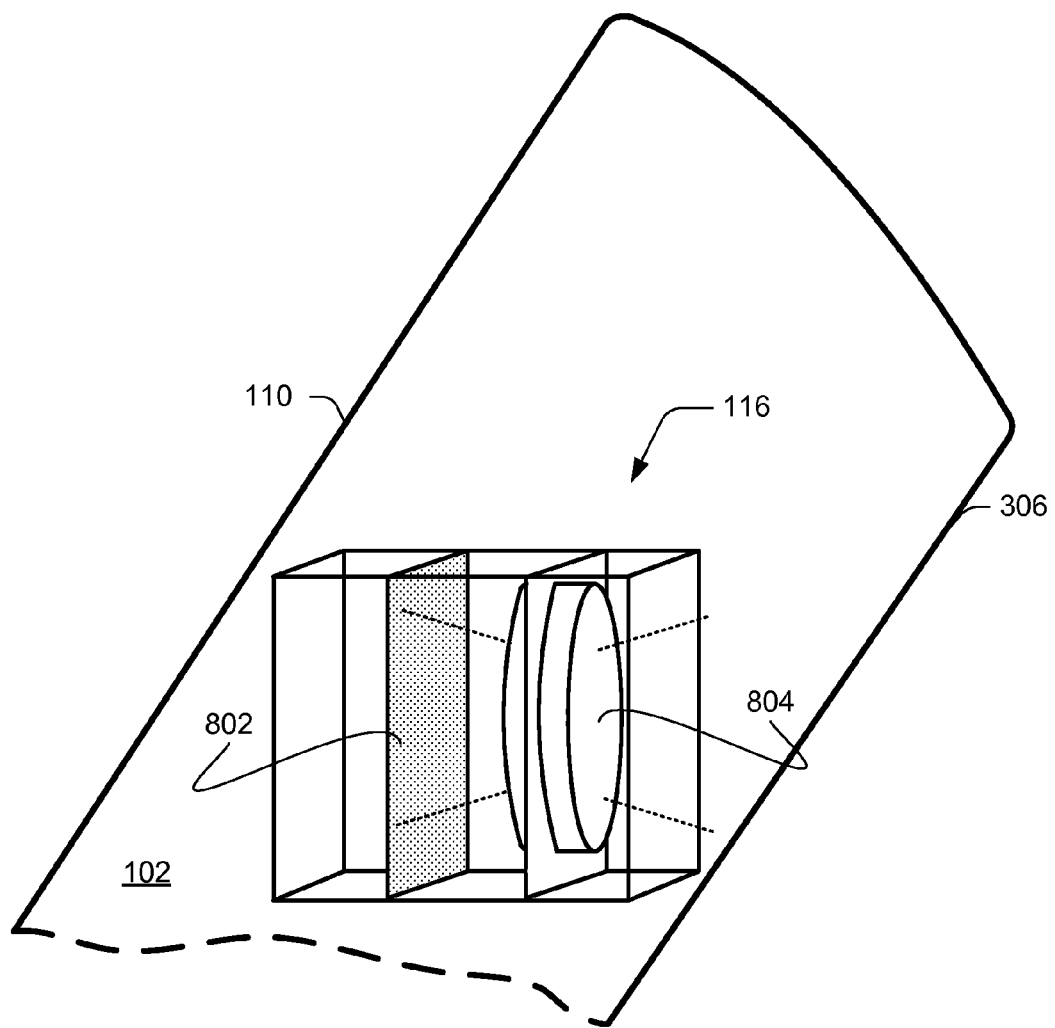
FIG. 9 depicts an example camera assembly in accordance with one or more embodiments.

FIG. 9 illustrates the camera assembly 116 in a partial view of the computing device 102. As shown in FIG. 9, the camera assembly 116 can be mounted at an angle in the computing device 102, such as with respect to the display device 110, the rear surface 306, and so on. Additionally or alternatively, the camera assembly can be physically adjustable in the computing device 102, such as via tilting, panning, rotating, and so on. For instance, the carrier 800 can be mounted on one or more axes, about which the carrier 800 can be manipulated to cause the camera assembly 116 to be angled in different directions.

Figure 10:
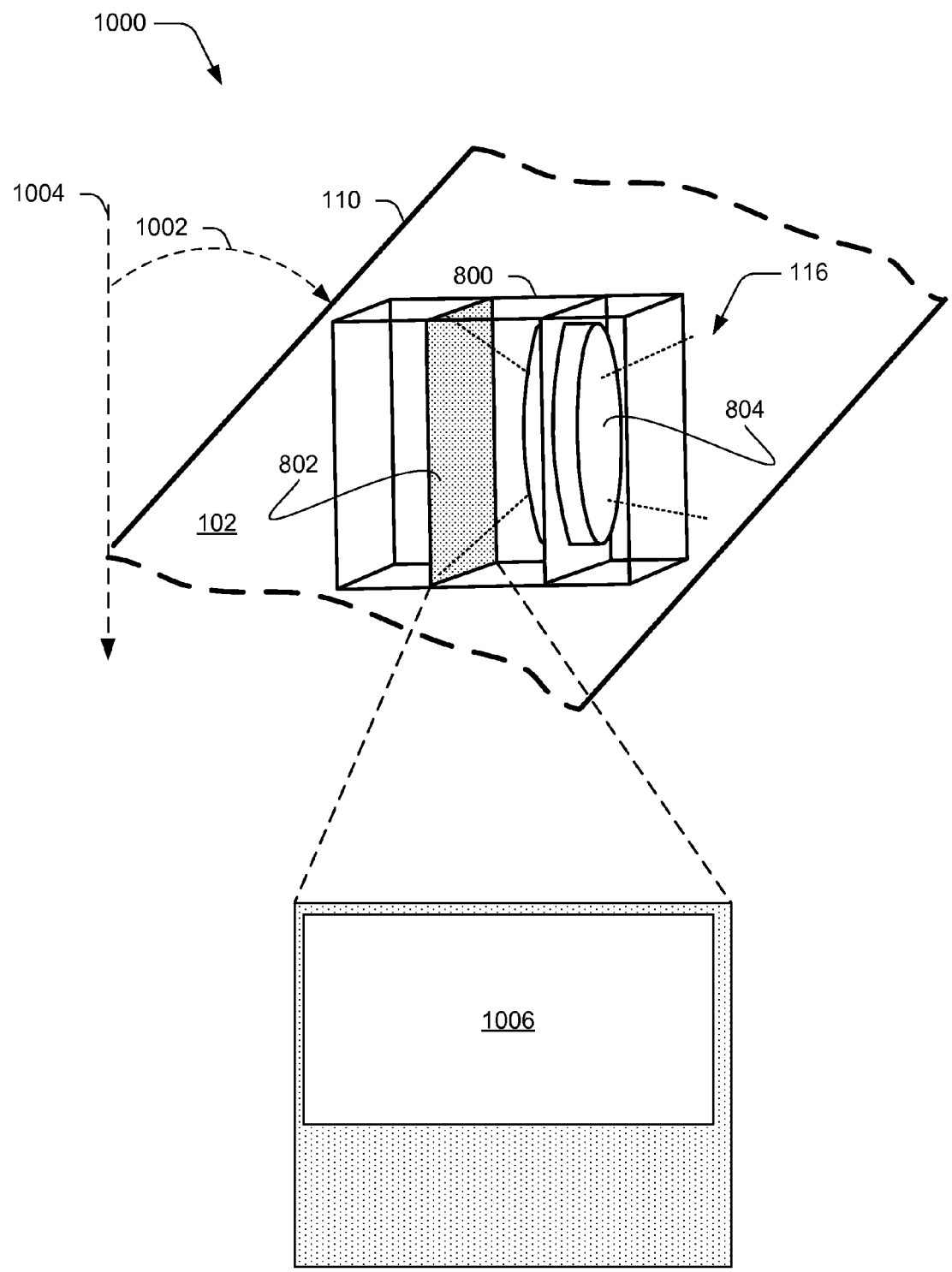
FIG. 10 depicts an example implementation scenario in accordance with one or more embodiments.

FIG. 10 illustrates an example scenario 1000, in which a region of the sensor 802 that is utilized to capture an image is based on a tilt angle of the computing device 102. In the upper portion of the scenario 1000, the computing device 102 is tilted at an angle 1002. The angle 1002, for instance, can be an angle of a plane formed by the display device 110, with reference to a gravitational vector 1004 detected via the orientation sensors 114.

In the lower portion of the scenario 1000, an image tile 1006 is defined for the sensor 802 based on the angle 1002. In at least some implementations, the sensor 802 can be mapped to determine which portion(s) of the sensor 802 to use to generate image data based on tilt angles of the computing device 102, the camera assembly 116, and so forth. In some orientations, for instance, the angle of incident light on the optical intake 804 can be such that light that passes through the optical intake 804 can focus on sub-portions of the sensor 802. This can enable a sensor to be divided into sub-portions (e.g., the image tile 1006) that are used to generate images based on determined angles of orientation. Additionally or alternatively, a sub-portion of the sensor 802 to be used to capture an image can be calculated on the fly, such as based on an angle of orientation, external light levels, resolution settings for the camera assembly 116, and so forth.

Mapping the sensor 802, for instance, can include determining a threshold optical signal-to-noise ratio (SNR) to be used to capture images. For example, image data received from the sensor 802 that exceeds the threshold SNR can be utilized to capture an image, while image data that does not exceed the threshold SNR can be ignored. Alternatively, image data that does not exceed the threshold SNR can be processed to increase the quality of a resulting image, such as using noise reduction techniques, light enhancement techniques, and so on.

Further to mapping the sensor 802, focus regions (e.g., image tiles) of the sensor 802 that correspond to particular orientation angles can be predetermined by measuring light intensity (e.g., signal intensity) on different regions of the sensor 802 when the computing device 102 is oriented at different angles. Regions that exceed a threshold light intensity can be used to capture an image, such as by defining image tiles within regions of the sensor 802 that receive focused light at and/or above the threshold light intensity.

Thus, the image tile 1006 corresponds to a portion of the sensor 802 that is used to capture an image when the computing device is positioned at the angle 1002. Further, data generated from regions of the sensor 802 that are external to the image tile 1006 can be ignored, or processed to enhance image quality. If the computing device 102 is tilted to a different angle, a different image tile can be determined. For instance, consider the following example.

Figure 11:
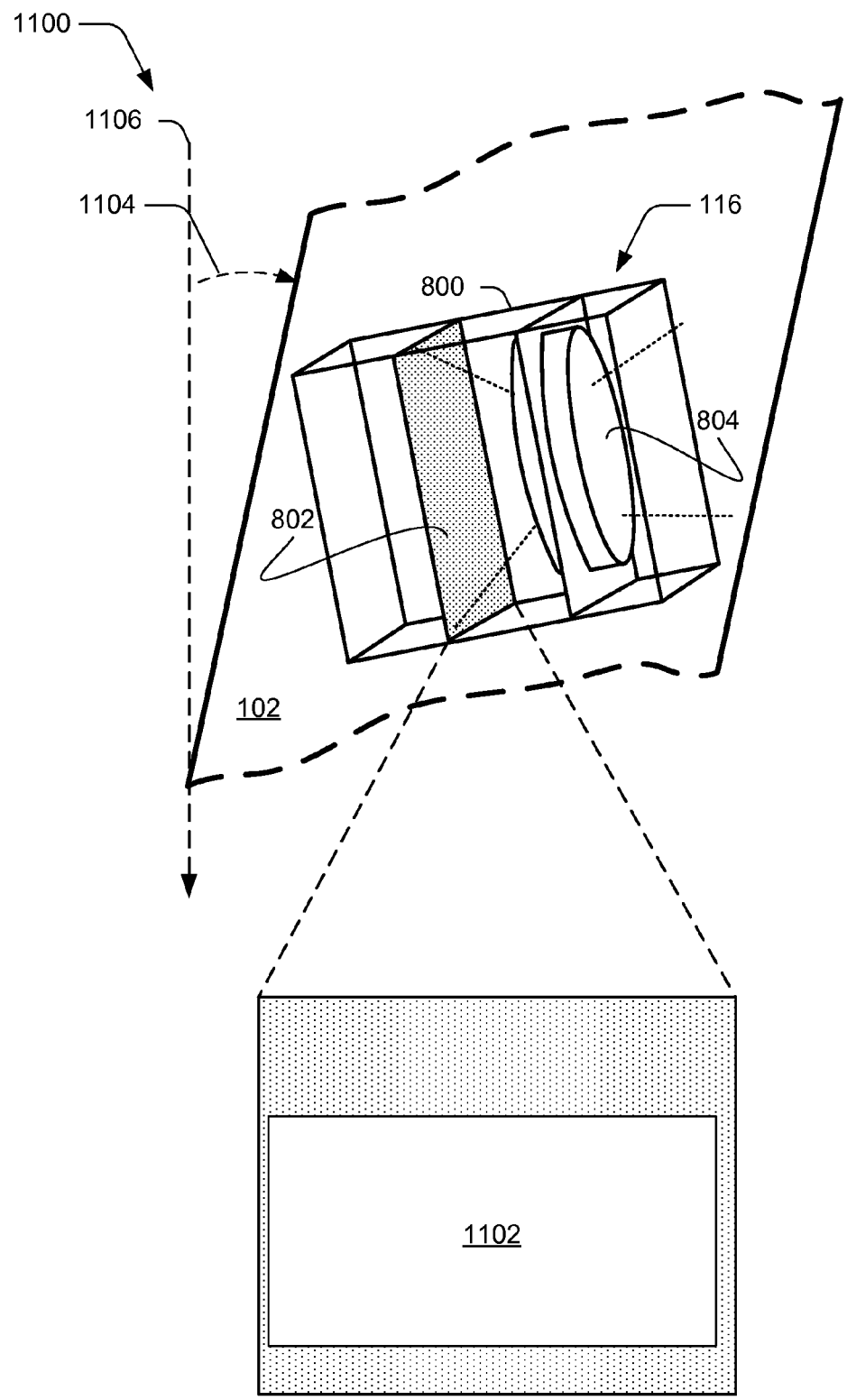
FIG. 11 depicts an example implementation scenario in accordance with one or more embodiments.

FIG. 11 illustrates an example scenario 1100, in which an image tile 1102 is defined based on an angle of orientation of the computing device 102. The computing device 102, for instance, can be positioned at an angle 1104 with reference to a gravitational vector 1106. Thus, the computing device 102 is positioned at a different orientation than described above with reference to FIG. 10. Thus, the image tile 1102 is defined at a different region of the sensor 802 than was the image tile 1006 described in FIG. 10. Accordingly, different portions of the sensor 802 can be used to capture images, based on an angle of orientation of the computing device 102, of the camera assembly 116, and so forth.

Example Procedure

Figure 12:
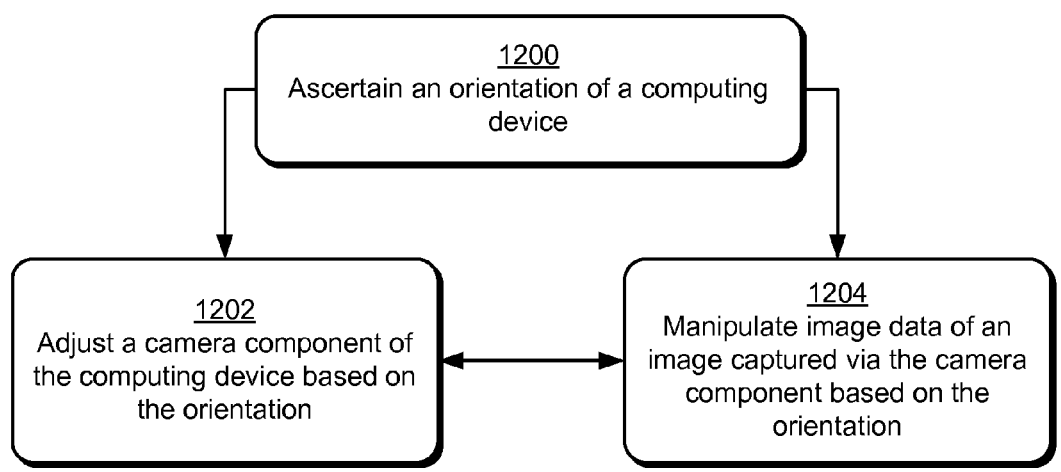
FIG. 12 is a flow diagram that describes steps in a method in accordance with one or more embodiments.

FIG. 12 is a flow diagram that describes steps in a method in accordance with one or more embodiments. In at least some embodiments, the method can be employed to determine an orientation of a computing device with respect to an input device.

Step 1200 ascertains an orientation of a computing device. For example, an orientation of the computing device 102 relative to earth's gravity (e.g., a gravitational vector) can be determined. In implementations, this can include determining an angle at which the computing device 102 is oriented with reference to earth's gravity. As referenced above, however, a variety of different techniques can be employed to ascertain an orientation of a computing device.

Step 1202 adjusts a camera component of the computing device based on the orientation. For instance, one or more of the carrier 800, the sensor 802, and/or the optical intake 804 can be physically tilted, panned, rotated, and so forth, based on an angle of orientation of the computing device 102. As referenced above, a variety of different types of mechanisms can be used to accomplish such adjustment. For instance, a motor can be attached to an axis of the carrier 800, and can rotate the carrier 800 to enable various components of the camera assembly 116 to be positioned at different angles.

Step 1204 manipulates image data for an image captured via the camera component based on the orientation. For instance, various types of image corrections and/or image enhancements can be applied to image data based on the orientation. In an example implementation, for instance, a specific region of the sensor 802 can be associated with low light levels at particular orientations of the computing device 102. Thus, when the computing device 102 is in such orientations, light enhancement and/or light correction techniques can be applied to image data received from the region. As another example, a specific region of the sensor 802 can be associated with image distortion (e.g., barrel distortion, pincushion distortion, and so forth) at particular orientations of the computing device 102. Thus, when the computing device 102 is in such orientations, image data correction techniques can be applied to image data received from the region to correct for the image distortion.

In implementations, steps 1200, 1202, and 1204 can occur together, sequentially, alternatively, and so on.

Example System and Device

Figure 13:
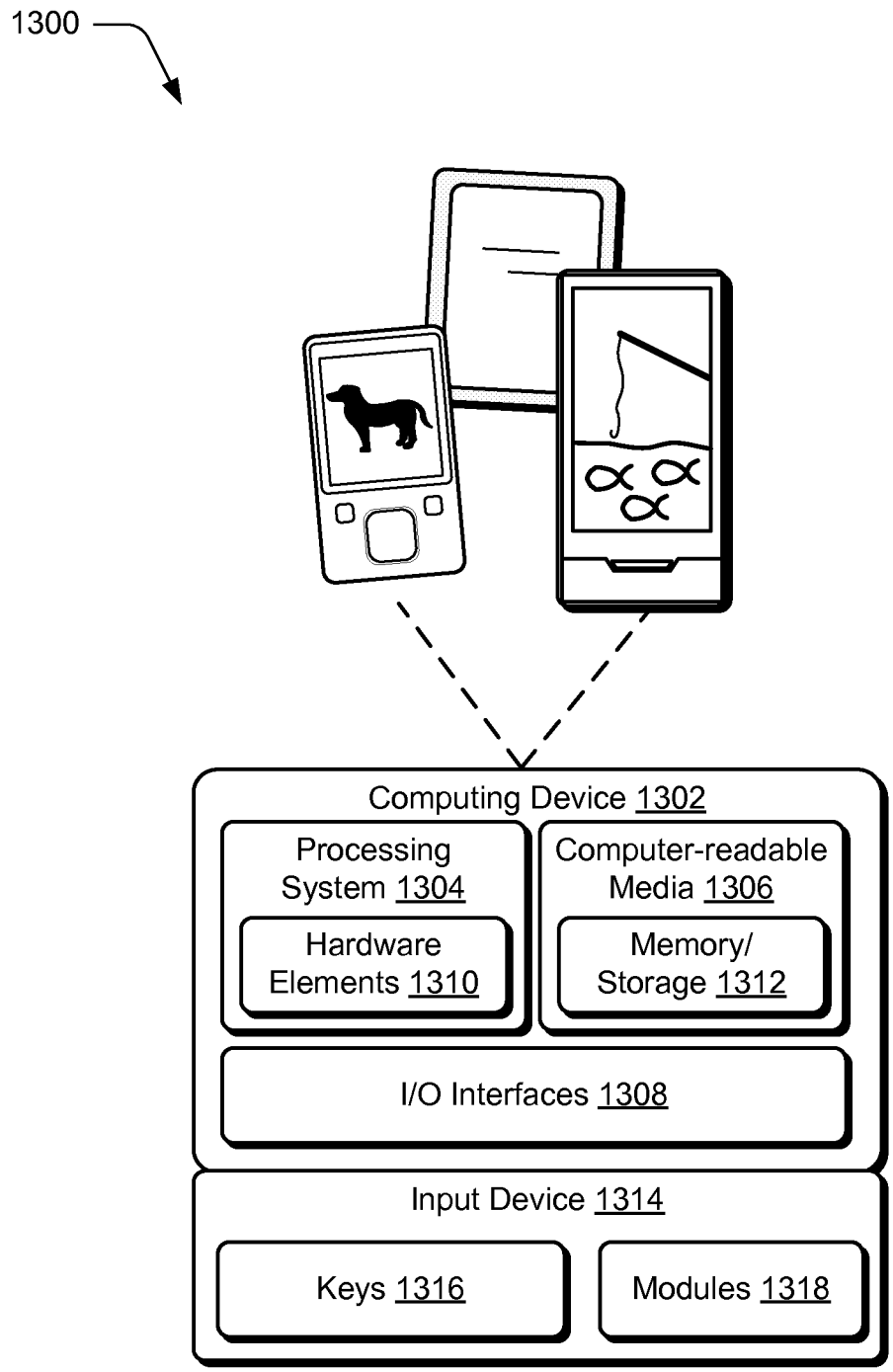
FIG. 13 illustrates an example system including various components of an example device that can be implemented as any type of computing device as described with reference to FIGS. 1-12 to implement embodiments of the techniques described herein.

FIG. 13 illustrates an example system generally at 1300 that includes an example computing device 1302 that is representative of one or more computing systems and/or devices that may implement the various techniques described herein. The computing device 1302 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1302 as illustrated includes a processing system 1304, one or more computer-readable media 1306, and one or more I/O interface 1308 that are communicatively coupled, one to another. Although not shown, the computing device 1302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1304 is representative of functionality to perform one or more operations using hardware. Accordingly, the processing system 1304 is illustrated as including hardware element 1310 that may be configured as processors, functional blocks, and so forth. This may include implementation in hardware as an application specific integrated circuit or other logic device formed using one or more semiconductors. The hardware elements 1310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1306 is illustrated as including memory/storage 1312. The memory/storage 1312 represents memory/storage capacity associated with one or more computer-readable media. The memory/storage component 1312 may include volatile media (such as random access memory (RAM)) and/or nonvolatile media (such as read only memory (ROM), Flash memory, optical disks, magnetic disks, and so forth). The memory/storage component 1312 may include fixed media (e.g., RAM, ROM, a fixed hard drive, and so on) as well as removable media (e.g., Flash memory, a removable hard drive, an optical disc, and so forth). The computer-readable media 1306 may be configured in a variety of other ways as further described below.

Input/output interface(s) 1308 are representative of functionality to allow a user to enter commands and information to computing device 1302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1302 may be configured in a variety of ways to support user interaction.

The computing device 1302 is further illustrated as being communicatively and physically coupled to an input device 1314 that is physically and communicatively removable from the computing device 1302. In this way, a variety of different input devices may be coupled to the computing device 1302 having a wide variety of configurations to support a wide variety of functionality. In this example, the input device 1314 includes one or more keys 1316, which may be configured as pressure sensitive keys, mechanically switched keys, and so forth.

The input device 1314 is further illustrated as include one or more modules 1318 that may be configured to support a variety of functionality. The one or more modules 1318, for instance, may be configured to process analog and/or digital signals received from the keys 1316 to determine whether a keystroke was intended, determine whether an input is indicative of resting pressure, support authentication of the input device 1314 for operation with the computing device 1302, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

Techniques may further be implemented in a network environment, such as utilizing various cloud-based resources. For instance, methods, procedures, and so forth discussed above may leverage network resources to enable various functionalities.

An implementation of the described modules and techniques may be stored on or transmitted across some form of computer-readable media. The computer-readable media may include a variety of media that may be accessed by the computing device 1302. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and nonvolatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1310 and computer-readable media 1306 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1310. The computing device 1302 may be configured to implement particular instructions and/or functions corresponding to the software and/or hardware modules. Accordingly, implementation of a module that is executable by the computing device 1302 as software may be achieved at least partially in hardware, e.g., through use of computer-readable storage media and/or hardware elements 1310 of the processing system 1304. The instructions and/or functions may be executable/operable by one or more articles of manufacture (for example, one or more computing devices 1302 and/or processing systems 1304) to implement techniques, modules, and examples described herein.

Discussed herein are a number of methods that may be implemented to perform techniques discussed herein. Aspects of the methods may be implemented in hardware, firmware, or software, or a combination thereof. The methods are shown as a set of blocks that specify operations performed by one or more devices and are not necessarily limited to the orders shown for performing the operations by the respective blocks. Further, an operation shown with respect to a particular method may be combined and/or interchanged with an operation of a different method in accordance with one or more implementations. Aspects of the methods can be implemented via interaction between various entities discussed above with reference to the environment 100.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computer-implemented method, comprising:
ascertaining an orientation of a computing device that includes a kickstand, the orientation being based at least in part on an angle of the kickstand relative to the computing device; and
manipulating image data captured via a sensor of a camera component of the computing device, including:
determining, based on the orientation, an image region that corresponds to a portion of the sensor;
utilizing a portion of the image data from the image region to capture an image; and
ignoring a different portion of the image data captured outside of the image region.

2. A method as described in claim 1, wherein the orientation comprises an angle at which the computing device is positioned relative to gravity.

3. A method as described in claim 1, further comprising changing an angle of orientation of one or more portions of the camera component with respect to the computing device based on the orientation of the computing device.

4. A method as described in claim 3, wherein said changing comprises one of more of tilting, rotating, or panning the one or more portions of the camera component with reference to the computing device.

5. A method as described in claim 1, wherein said manipulating comprises applying one or more image data correction techniques to the image data.

6. A method as described in claim 1, wherein said ignoring is in response to determining that the different portion of the image data does not exceed a threshold signal-to-noise ratio.

7. A method as described in claim 1, wherein the image region corresponds to a portion of the sensor that receives light at a threshold light intensity.

8. A method as described in claim 1, further comprising:
ascertaining a change in orientation of the computing device; and
determining, based on the change in orientation, a different image region that corresponds to a different portion of the sensor to be used for capturing a different image.

9. An apparatus comprising:
a computing device including a kickstand that is positionable to enable the computing device to be supported on a surface;
a camera assembly operably attached at a fixed angle within the computing device at an angle such that when the computing device is supported via the kickstand on the surface, an optical axis of one or more components of the camera assembly is substantially parallel to the surface, the camera assembly including an image sensor for capturing an image; and a camera module configured to select a portion of the image sensor to be used to capture an image based on one or more of an angle of orientation of the computing device or an external light level.

10. An apparatus as described in claim 9, wherein the angle is such that when the computing device is supported via the kickstand on the surface, a field of view of one or more components of the camera assembly is substantially perpendicular to the surface.

11. An apparatus as described in claim 9, further comprising an input device that is attached to the computing device and that is rotatable to different positions with respect to the computing device, at least one of the positions corresponding to a typing position in which the computing device is supported by the kickstand and input can be provided to the computing device via the input device.

12. An apparatus as described in claim 9, further comprising:

a display device disposed on a front surface of the computing device, and an input device that is attached to the computing device and that is rotatable to different positions with respect to the computing device, at least one of the positions corresponding to handheld position in which the input device is rotated against a rear surface of the computing device such that images in a field of view of one or more components of the camera assembly can be viewed via the display device and captured.

13. An apparatus as described in claim 9, wherein the computing device includes functionality to:

determine an orientation of the computing device; and apply one or more of light enhancement or light correction to a portion of the image data based on the orientation.

14. An apparatus as described in claim 9, wherein the computing device includes functionality to:

determine an orientation of the computing device; and perform image manipulation of an image captured via the camera assembly based on the orientation.

15. An apparatus as described in claim 9, wherein the one or more components of the camera assembly comprises a lens.

16. An apparatus comprising:

a computing device;

a display device disposed on a front surface of a computing device;

an input device operably attached to the computing device and that is rotatable to support different orientations of the computing device, at least one of the orientations enabling the display device to be covered by the input device;

a kickstand disposed on a rear surface of the computing device and configured to support the computing device on a surface;

a camera assembly mounted to the computing device such that a field of view of the camera assembly faces away from the display device, one or more components of the camera assembly being angled on the computing device based on an angle at which the kickstand is configured to support the computing device; and a sensor mechanism configured to detect an angle of the kickstand relative to the computing device; and a camera module configured to adjust one or more components of the camera assembly by one or more of panning or tilting the one or more components relative to the computing device and based on the detected angle of the kickstand relative to the computing device.

17. An apparatus as recited in claim 16, wherein the camera assembly is physically adjustable via one or more of tilting, rotating, or panning, to support image capture in different orientations of the computing device.

18. An apparatus as recited in claim 16, wherein the one or more components of the camera assembly are angled on the computing device such that when the kickstand supports the computing device on the surface, a field of view of the one or more components is substantially perpendicular to the surface.

19. An apparatus as recited in claim 16, wherein the computing device includes:

functionality to ascertain an orientation of the computing device; and functionality to perform one or more of:

adjusting the one or more components of the camera assembly based on the orientation of the computing device; or manipulating image data captured via the camera component based on the orientation of the computing device.

20. An apparatus as recited in claim 19, wherein the functionality to ascertain an orientation of the computing device comprises functionality to determine an angle of the computing device with reference to gravity.

* * * * *